(12) United States Patent
Joo et al.

(10) Patent No.: US 11,450,714 B2
(45) Date of Patent: Sep. 20, 2022

(54) DISPLAY PANEL AND DISPLAY DEVICE INCLUDING THE SAME

(71) Applicant: SAMSUNG DISPLAY CO., LTD., Yongin-Si (KR)

(72) Inventors: Sun-Kyu Joo, Suwon-Si (KR); Keunchan Oh, Hwaseong-Si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 186 days.

(21) Appl. No.: 16/592,384

(22) Filed: Oct. 3, 2019

(65) Prior Publication Data

US 2020/0194502 A1 Jun. 18, 2020

(30) Foreign Application Priority Data

Dec. 18, 2018 (KR) .................. 10-2018-0163806

(51) Int. Cl.
*H01L 27/32* (2006.01)
*H01L 51/52* (2006.01)

(52) U.S. Cl.
CPC ........ *H01L 27/322* (2013.01); *H01L 51/5284* (2013.01)

(58) Field of Classification Search
CPC ............. H01L 51/5281; H01L 51/5284; H01L 27/322
See application file for complete search history.

(56) References Cited

U.S. PATENT DOCUMENTS

| | | | |
|---|---|---|---|
| 9,088,003 B2 | 7/2015 | Gupta et al. | |
| 9,263,502 B2 | 2/2016 | Heo | |
| 2009/0091238 A1 | 4/2009 | Cok et al. | |
| 2016/0300888 A1 | 10/2016 | Wang et al. | |
| 2016/0300889 A1 | 10/2016 | Kim et al. | |
| 2017/0242292 A1* | 8/2017 | Jeon .................. | G02F 1/133617 |
| 2017/0317316 A1* | 11/2017 | Yang .................. | H01L 51/5284 |
| 2018/0088404 A1 | 3/2018 | Chae et al. | |
| 2018/0113356 A1 | 4/2018 | Lee et al. | |
| 2018/0164640 A1* | 6/2018 | Kim .................. | G02F 1/133504 |
| 2018/0211979 A1 | 7/2018 | Lee et al. | |

(Continued)

FOREIGN PATENT DOCUMENTS

| | | |
|---|---|---|
| EP | 2207207 | 7/2010 |
| KR | 10-2011-0081565 | 7/2011 |

(Continued)

*Primary Examiner* — Vongsavanh Sengdara
(74) *Attorney, Agent, or Firm* — F. Chau & Associates, LLC

(57) ABSTRACT

A display panel includes a display element layer configured to output first color light, an encapsulation layer disposed on the display element layer, a light control layer disposed on the encapsulation layer and including a first conversion part configured to output second color light, a second conversion part configured to output third color light, and a transmission part configured to transmit the first color light, a light absorbing layer disposed on the encapsulation layer to cover the first and second conversion parts and expose at least a portion of a top surface of the transmission part, and a color filter layer disposed on the light absorbing layer. The light absorbing layer is configured to absorb the first color light and to transmit the second color light and the third color light.

20 Claims, 18 Drawing Sheets

(56) References Cited

U.S. PATENT DOCUMENTS

2019/0013363 A1 1/2019 Joo et al.
2019/0302519 A1 10/2019 Park et al.

FOREIGN PATENT DOCUMENTS

| KR | 10-2014-0085951 | 7/2014 |
| KR | 10-2016-0112499 | 9/2016 |
| KR | 10-2018-0038608 | 4/2018 |
| KR | 10-2018-0068625 | 6/2018 |

* cited by examiner

DISPLAY PANEL AND DISPLAY DEVICE INCLUDING THE SAME

CROSS-REFERENCE TO RELATED APPLICATION

This U.S. non-provisional patent application claims priority under 35 U.S.C. § 119 to Korean Patent Application No. 10-2018-0163806, filed on Dec. 18, 2018, the disclosure of which is incorporated by reference herein.

BACKGROUND

1. Technical Field

The present disclosure herein relates to a display device, and more particularly, to a display panel and a display device including the same.

2. Discussion of Related Art

Various display devices used in multimedia devices such as televisions, portable phones, tablet computers, navigation systems, and game consoles have been developed. A display device may include a transmissive display panel which selectively transmits source light generated from a light source, or a light emitting display panel which generates source light by itself.

A transmissive display panel looks great in indoor environments but can appear quite dim when used outdoors in direct sunlight. Since sunlight can be a thousand times brighter than that of the light source of the display device, it can adversely affect the appearance of the display device. External light from sunlight or very bright incandescent or fluorescent bulbs may be reflected and/or scattered at a display surface of the transmissive display panel on which an image is displayed, thereby reducing quality of the image.

SUMMARY

At least one embodiment of the present inventive concept may provide a display panel capable of reducing reflection of external light and improving visibility, and a display device including the same.

According to an exemplary embodiment of the inventive concept, a display panel includes a display element layer, an encapsulation layer, a light control layer, a light absorbing layer, and a color filter layer. The display element layer is configured to output first color light. The encapsulation layer is disposed on the display element layer. The light control layer is disposed on the encapsulation layer and includes a first conversion part configured to receive the first color light and to output second color light different from the first color light, a second conversion part configured to receive the first color light and to output third color light different from the first color light and the second color light, and a transmission part configured to transmit the first color light. The light absorbing layer is disposed on the encapsulation layer to cover the first and second conversion parts and exposes at least a portion of a top surface of the transmission part facing the color filter. The color filter layer is disposed on the light absorbing layer. The light absorbing layer is configured to absorb the first color light and to transmit the second color light and the third color light.

In an embodiment, the first conversion part, the second conversion part and the transmission part are spaced apart from each other in a plan view and are disposed directly on the encapsulation layer, where the light absorbing layer overlaps an area between the first conversion part and the second conversion part, and an area between the second conversion part and the transmission part.

In an embodiment, the color filter layer includes a first color filter which overlaps with the first conversion part, is disposed on the light absorbing layer, and has the second color, a second color filter which overlaps with the second conversion part, is disposed on the light absorbing layer, and has the third color, and a third color filter overlapping with the transmission part and having the first color.

In an embodiment, the display panel includes first to third pixel areas respectively overlapping with the first to third color filters and a light blocking area partitioning the first to third pixel areas, and the third pixel area overlaps with the top surface of the transmission part exposed by the light absorbing layer.

In an embodiment, the third color filter includes a filter portion overlapping with the third pixel area and disposed on the transmission part, and a light blocking portion overlapping with the light blocking area and disposed on the light absorbing layer.

In an embodiment, the light blocking portion covers a portion of each of the first and second color filters and is disposed on the light absorbing layer.

In an embodiment, the light blocking portion is disposed on the light absorbing layer, and each of the first and second color filters covers at least a portion of the light blocking portion and is disposed on the light absorbing layer.

In an embodiment, the first color is a blue color and the light absorbing layer has a yellow color.

In an embodiment, the encapsulation layer has the first color.

In an embodiment, the light absorbing layer includes a light absorbing dye configured to absorb light, corresponding to a predetermined wavelength range, of light incident from an outside.

In an embodiment, the light absorbing dye is configured to absorb light corresponding to a wavelength range between a peak wavelength of the second color light and a peak wavelength of the third color light, a peak wavelength of the first color light is less than the peak wavelength of the third color light, and the peak wavelength of the third color light is less than the peak wavelength of the second color light.

In an embodiment, the display panel includes first to third pixel areas and a light blocking area partitioning the first to third pixel areas. In this embodiment, the display element layer includes first to third light emitting elements which overlap with the first to third pixel areas, respectively, and each light emitting element includes a first electrode, a second electrode, and an emission layer between the first and second electrodes. In this embodiment, the emission layers of the first to third light emitting elements are connected to each other to constitute a single unitary body shape.

In an embodiment, at least one of the first electrode or the second electrode have an uneven shape.

In an embodiment, the first conversion part includes a first illuminant configured to convert the first color light into the second color light, and the second conversion part includes a second illuminant configured to convert the first color light into the third color light.

According to an exemplary embodiment of the inventive concept, a display device includes a window, a display panel, and an adhesive layer disposed between the window and the display panel. The display panel includes a display element layer configured to output first color light, an encapsulation layer disposed on the display element layer, a light control layer disposed on the encapsulation layer and including a first conversion part configured to receive the first color light and to output second color light different from the first color light, a second conversion part configured to receive the first color light and to output third color light different from the first color light and the second color light, and a transmission part configured to transmit the first color light, a light absorbing layer disposed on the encapsulation layer to cover the first and second conversion parts and expose at least a portion of a top surface of the transmission part facing the color filter, and a color filter layer disposed on the light absorbing layer. The light absorbing layer is configured to absorb the first color light and to transmit the second color light and the third color light. The adhesive layer is disposed between the color filter layer and the window.

In an embodiment, the adhesive layer includes a light absorbing dye configured to absorb light, corresponding to a predetermined wavelength range, of light incident from an outside.

In an embodiment, the light absorbing dye includes a first absorbing dye configured to absorb light corresponding to a first wavelength range between a peak wavelength of the first color light and a peak wavelength of the third color light, and a second absorbing dye configured to absorb light corresponding to a second wavelength range between a peak wavelength of the second color light and the peak wavelength of the third color light. In this embodiment, the peak wavelength of the first color light is less than the peak wavelength of the third color light, and the peak wavelength of the third color light is less than the peak wavelength of the second color light.

In an embodiment, the light absorbing dye further includes a third absorbing dye configured to absorb light corresponding to a third wavelength range higher than the peak wavelength of the second color light.

In an embodiment, the light control layer is disposed directly on the encapsulation layer, the first color is a blue color, and the light absorbing layer has a yellow color.

According to an exemplary embodiment of the inventive concept, a display panel includes a display element layer including first to third light emitting elements configured to output first color light, an encapsulation layer disposed on the display element layer, a light control layer which includes first to third pixel areas respectively overlapping with the first to third light emitting elements and a light blocking area partitioning the first to third pixel areas, is disposed on the encapsulation layer, and is configured to receive the first color light and to output second color light different from the first color light, and a light absorbing layer disposed on the encapsulation layer and including a first light absorbing portion overlapping with the first pixel area, a second light absorbing portion overlapping with the second pixel area, and a third light absorbing portion overlapping with the light blocking area. In this embodiment, the light absorbing layer is configured to absorb the first color light and to transmit the second color light.

According to an exemplary embodiment of the inventive concept, a display panel includes a display element layer configured to output first color light, an encapsulation layer disposed on the display element layer, a light control layer disposed on the encapsulation layer, a light absorbing layer, and a color filter layer disposed on the light absorbing layer. The light control layer includes a first resin configured to receive the first color light and to output second color light different from the first color light, a second resin configured to receive the first color light and to output third color light different from the first color light and the second color light, and a third resin configured to transmit the first color light. The light absorbing layer is configured to absorb the first color light and to transmit the second color light and the third color light.

In an embodiment, the first resin, the second resin and the third resin are spaced apart from each other in a plan view and are disposed directly on the encapsulation layer.

In an embodiment, the light absorbing layer overlaps an area between the first resin and the second resin, and an area between the second resin and the third resin.

In an embodiment, the display element layer comprises a light emitting element comprising a first electrode, a second electrode, and an emission layer between the first and second electrodes, wherein at least one of the first electrode or the second electrode has an uneven shape.

Additional features and advantages of the above embodiments and additional embodiments of the present disclosure are outlined in the description which follows, and in part will be apparent from the description, or may be learned by the practice of such example embodiments.

BRIEF DESCRIPTION OF THE DRAWINGS

The accompanying drawings are included to provide a further understanding of the inventive concepts, and are incorporated in and constitute a part of this specification. The drawings illustrate exemplary embodiments of the inventive concepts and, together with the description, serve to explain principles of the inventive concepts. In the drawings.

DETAILED DESCRIPTION OF THE EXEMPLARY EMBODIMENTS

Figure 1A:
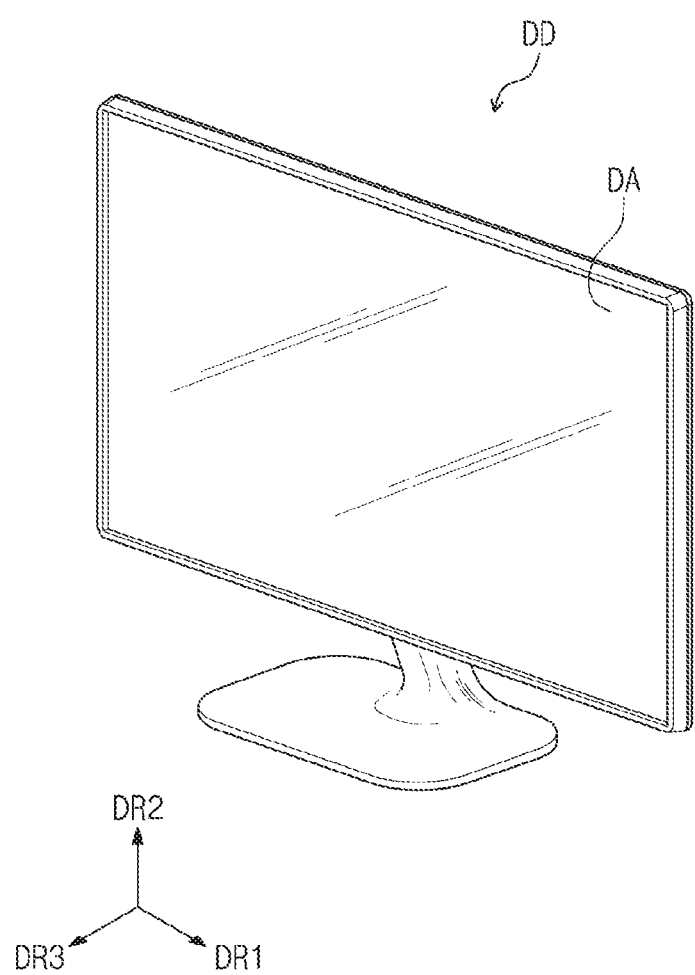
FIG. 1A is a perspective view illustrating a display device according to an exemplary embodiment of the inventive concept.

The inventive concepts now will be described more fully hereinafter with reference to the accompanying drawings, in which various embodiments are shown. The inventive concepts may, however, be embodied in many different forms, and should not be construed as limited to the embodiments set forth herein. Rather, these embodiments are provided so that this disclosure will be thorough and complete, and will fully convey the scopes of the inventive concepts to those skilled in the art. Like reference numerals refer to like elements throughout.

It will be understood that when an element such as a layer, region or substrate is referred to as being "on" another element, it can be directly on the other element or intervening elements may be present. As used herein, the singular forms "a," "an," and "the" are intended to include the plural forms, including "at least one," unless the content clearly indicates otherwise. As used herein, the term "and/or" includes any and all combinations of one or more of the associated listed items. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Hereinafter, exemplary embodiments of the inventive concept will be described in detail with reference to the accompanying drawings.

Figure 1B:
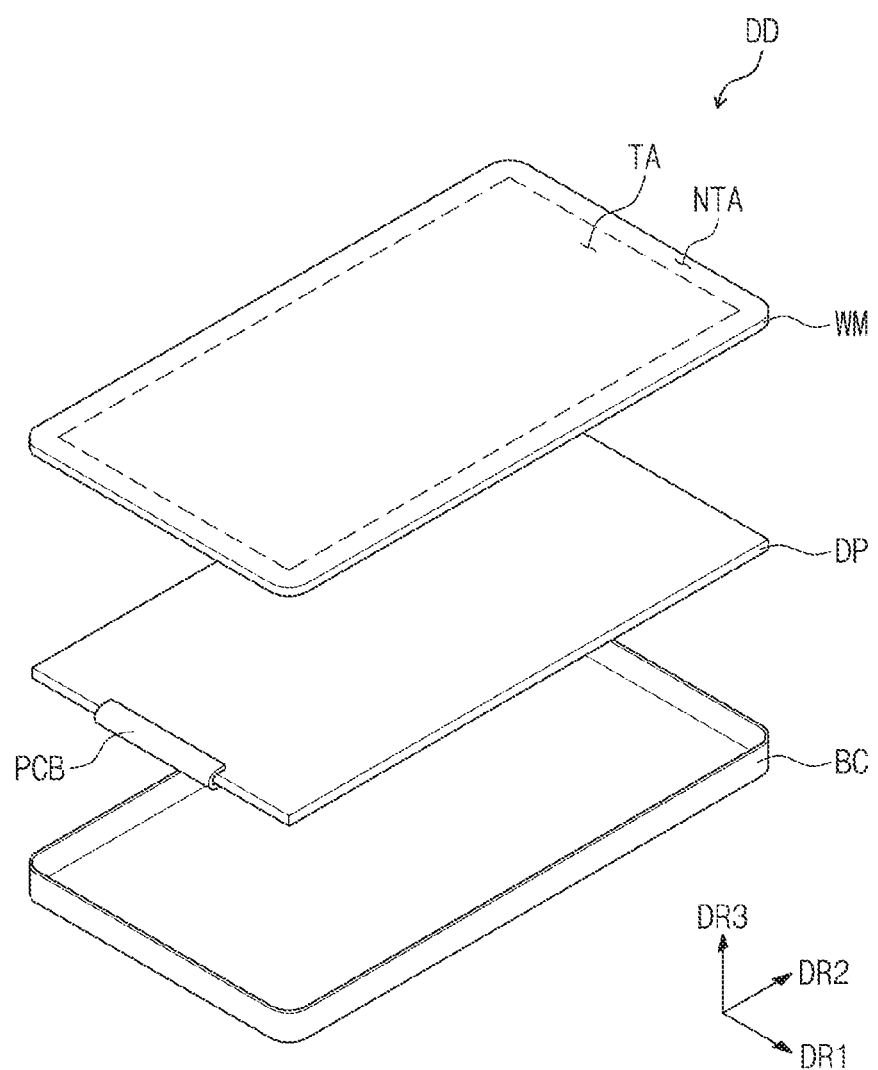
FIG. 1B is an exploded perspective view illustrating a display device according to an exemplary embodiment of the inventive concept.

FIG. 1A is a perspective view illustrating a display device according to an exemplary embodiment of the inventive concept. FIG. 1B is an exploded perspective view illustrating the display device according to an exemplary embodiment of the inventive concept.

Referring to FIG. 1A, a display device DD displays an image through a display area DA. In FIG. 1A, the display area DA is provided in a plane defined by a first direction DR1 and a second direction DR2 intersecting the first direction DR1. A thickness direction of the display device DD may be indicated by a third direction DR3. However, directions indicated by the first to third directions DR1, DR2 and DR3 may be relative concepts and may be changed into other directions. The clause "when viewed in a plan view" or "in a plan view" used herein may mean a clause "when viewed in the third direction DR3". In addition, a thickness direction may mean the third direction DR3.

In FIG. 1A, a television is illustrated as an example of the display device DD. However, in other embodiments, the display device DD may also be applied to large-sized electronic devices (e.g., monitors and external billboards) and small and middle-sized electronic devices (e.g., personal computers, notebook computers, personal digital assistants (PDAs), car navigation units, game consoles, smart phones, tablets, and cameras). However, these are provided as examples according to embodiments of the inventive concepts, and the display device DD according to embodiments of the inventive concepts may also be applied to other electronic devices.

Referring to FIG. 1B, the display device DD includes a window WM, a display panel DP, and a bottom chassis BC.

The window WM may be disposed on the display panel DP and may transmit an image, provided from the display panel DP, through a transmission area TA. In detail, the window WM may include the transmission area TA and a non-transmission area NTA. The transmission area TA may overlap with the display area DA and may have a shape corresponding to that of the display area DA. An image displayed in the display area DA of the display device DD may be visible to the outside through the transmission area TA of the window WM.

The non-transmission area NTA may surround the transmission area TA in a plan view or may be adjacent to a side of the transmission area TA. In particular, the non-transmission area NTA may overlap with a non-display area DP-NDA adjacent to a display area DP-DA in the display panel DP and may have a shape corresponding to that of the non-display area DP-NDA. In an exemplary embodiment, a light transmittance of the non-transmission area NTA is less than a light transmittance of the transmission area TA. In certain embodiments, the non-transmission area NTA may be omitted.

For example, the window WM may be formed of transparent material such as glass, sapphire, or plastic. The window WM is illustrated as a single layer in FIG. 1B. Alternatively, the window WM may include a plurality of layers. In an embodiment, the window WM may include a base layer and at least one printed layer disposed on a rear surface of the base layer. The printed layer may overlap with the non-transmission area NTA. The printed layer may have a predetermined color. For example, the printed layer may have a black color or may have another color different from the black color.

The display panel DP may be disposed between the window WM and the bottom chassis BC. The display panel DP may generate an image and may provide the generated image to the window WM. According to some embodiments of the inventive concepts, the display panel DP may be, but is not limited to, an organic light emitting display panel or a quantum-dot light emitting display panel. The organic light emitting display panel may include organic light emitting elements. The quantum-dot light emitting display panel may include quantum dots or quantum rods.

The case in which the display panel DP is the organic light emitting display panel will be described hereinafter as an example. However, embodiments of the inventive concepts are not limited thereto. In other words, other various display panels may be applied to embodiments of the inventive concept.

Even though not shown in the drawings, an input sensing unit (e.g., a sensing device or circuit) may be disposed on the display panel DP. In this case, the input sensing unit may be disposed between the window WM and the display panel DP. The input sensing unit may sense an external input provided from the outside. The external input provided from the outside may be provided in various forms. For example, the external input may include at least one of various external inputs such as a part (e.g., a finger) of a user's body, light, heat, and pressure. In addition, the external input may include an approaching spatial touch (e.g., a hovering touch) as well as the touch of the part of the user's body. For example, the input sensing unit could include one or more resistive touch sensors or capacitive touch sensors.

The bottom chassis BC may be coupled to the window WM. The bottom chassis BC may provide a rear surface of the display device DD and may be coupled to the window WM to define an inner space. The bottom chassis BC may be formed of a material having relatively high rigidity. For example, the bottom chassis BC may include a plurality of frames and/or plates, which are formed of glass, plastic, and/or a metal. The bottom chassis BC may stably protect the components of the display device DD, which are disposed in the inner space, from an external impact.

In the above description, the bottom chassis BC is formed of the material having the high rigidity. However, embodiments of the inventive concepts are not limited thereto. In another embodiment, the bottom chassis BC is formed of a flexible material. Even though not shown in the drawings, when the display device DD according to an embodiment of the inventive concepts is foldable or bendable, components included in the display device DD are flexible.

Figure 2:
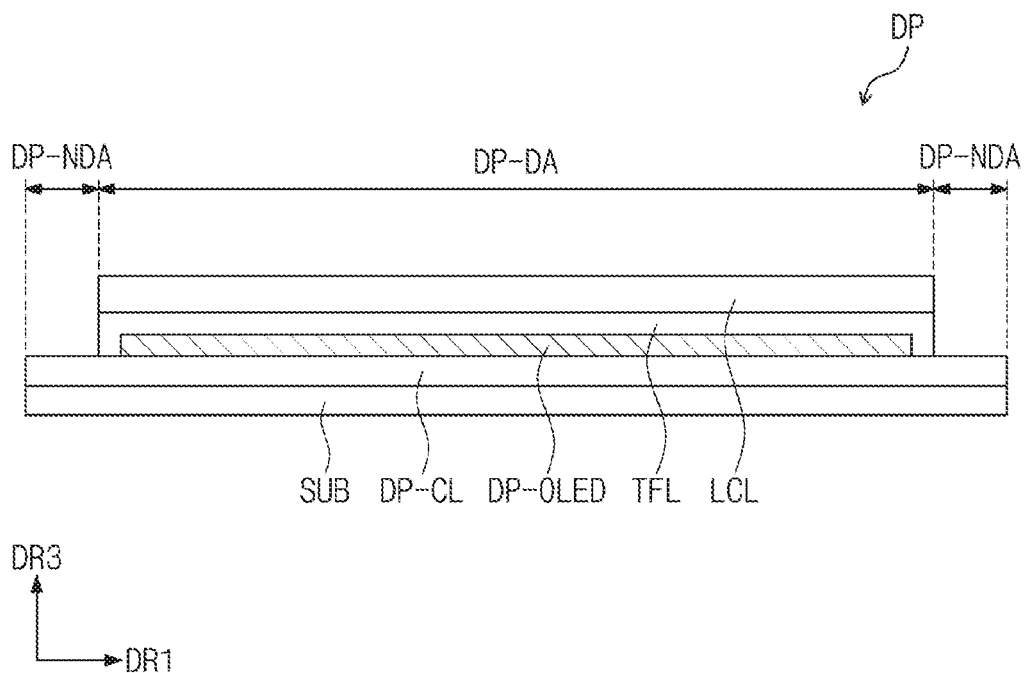
FIG. 2 is a cross-sectional view illustrating a display panel according to an exemplary embodiment of the inventive concept.

FIG. 2 is a cross-sectional view illustrating a display panel according to an embodiment of the inventive concepts. The display panel of FIG. 2 may be used to implement the display panel of FIG. 1B. Referring to FIG. 2, the display panel DP includes a base substrate SUB, a circuit element layer DP-CL, a display element layer DP-OLED, an encapsulation layer TFL, and a light conversion layer LCL.

The display panel DP includes a display area DP-DA and a non-display area DP-NDA. The display area DP-DA of the display panel DP may overlap with the display area DA of the display device DD described with reference to FIG. 1A. The non-display area DP-NDA may surround the display area DP-DA in a plan view or may be adjacent to a side of the display area DP-DA. In another embodiment, the non-display area DP-NDA is omitted.

The base substrate SUB may support components of the display panel DP and may include, for example, a flexible material. For example, the base substrate SUB may include a plastic substrate, a glass substrate, or an organic/inorganic composite substrate. Alternatively, the base substrate SUB may have a stack structure including a plurality of insulating layers. The plastic substrate may include at least one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

The circuit element layer DP-CL may include a plurality of insulating layers, a plurality of conductive layers, and a semiconductor layer. The plurality of conductive layers of the circuit element layer DP-CL may include signal lines and/or a control circuit of a pixel.

The display element layer DP-OLED may overlap with the display area DP-DA and may be disposed on the base substrate SUB. The display element layer DP-OLED may include display elements, e.g., organic light emitting diodes. However, embodiments of the inventive concepts are not limited thereto. In other embodiments, the display element layer DP-OLED may include inorganic light emitting diodes or organic-inorganic hybrid light emitting diodes, depending on a type of the display panel DP.

The encapsulation layer TFL may encapsulate the display element layer DP-OLED. For example, the encapsulation layer TFL may overlap with the display area DP-DA and the non-display area DP-NDA. Alternatively, the encapsulation layer TFL overlaps with the display area DP-DA but does not overlap with the non-display area DP-NDA. The encapsulation layer TFL may protect the display element layer DP-OLED from foreign materials such as moisture, oxygen, and dust particles.

In an embodiment, the encapsulation layer TFL includes at least one encapsulation organic layer and at least one encapsulation inorganic layer. The encapsulation inorganic layer may protect the display element layer DP-OLED from moisture/oxygen, and the encapsulation organic layer may protect the display element layer DP-OLED from a foreign material such as dust particles. The encapsulation inorganic layer may include at least one of, but not limited to, a silicon nitride layer, a silicon oxynitride layer, a silicon oxide layer, a titanium oxide layer, or an aluminum oxide layer. The encapsulation organic layer may include, but not limited to, an acrylic-based organic layer.

The light conversion layer LCL may be disposed on the encapsulation layer TFL. In an embodiment, the light conversion layer LCL is formed directly on the encapsulation layer TFL by a continuous process. In an embodiment, the light conversion layer LCL receives first color light outputted from the display element layer DP-OLED and outputs light having a different color from that of the first color light. The light conversion layer LCL will be described below in more detail.

Figure 3A:
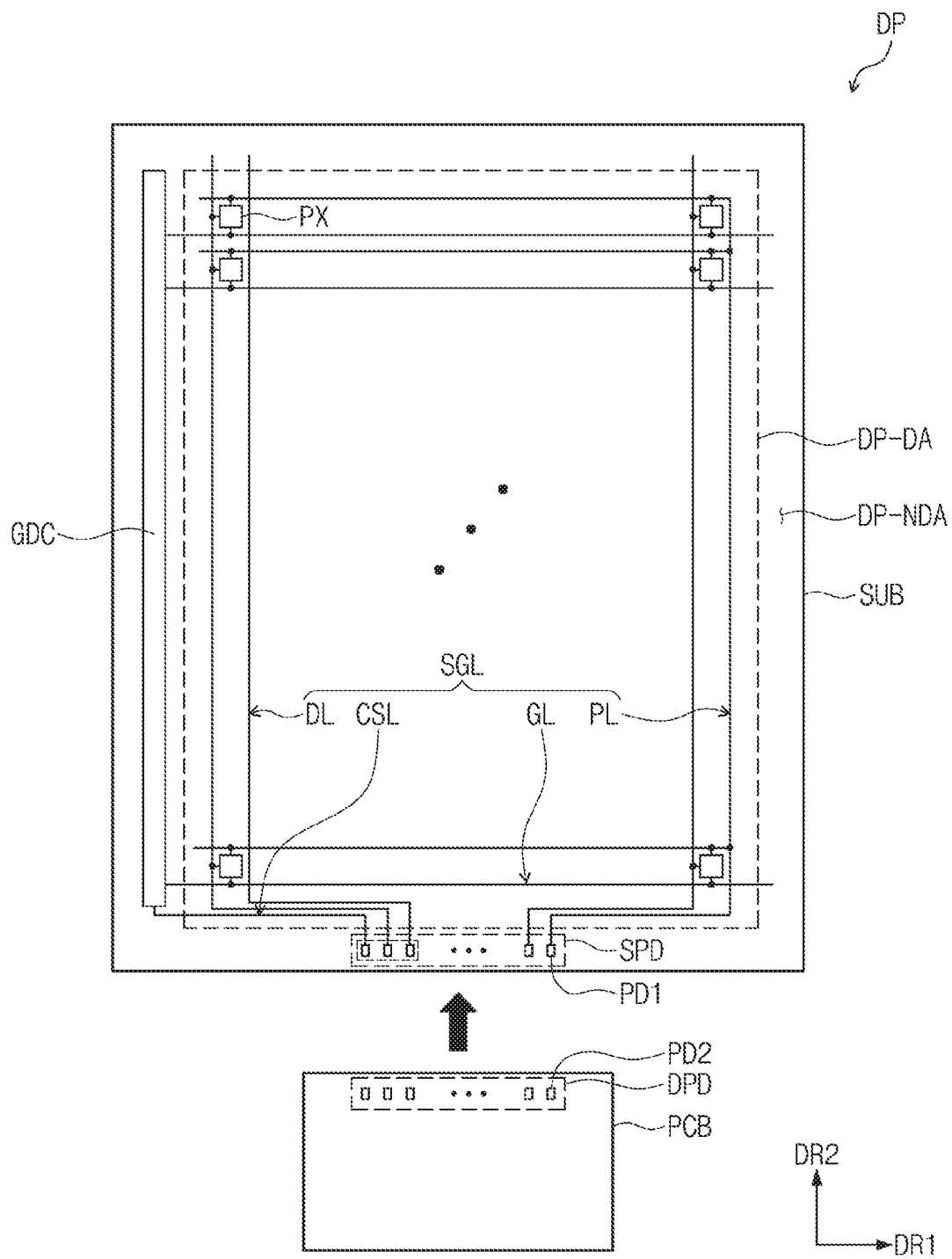
FIG. 3A is a plan view illustrating a display panel according to an exemplary embodiment of the inventive concept.
Figure 3B:
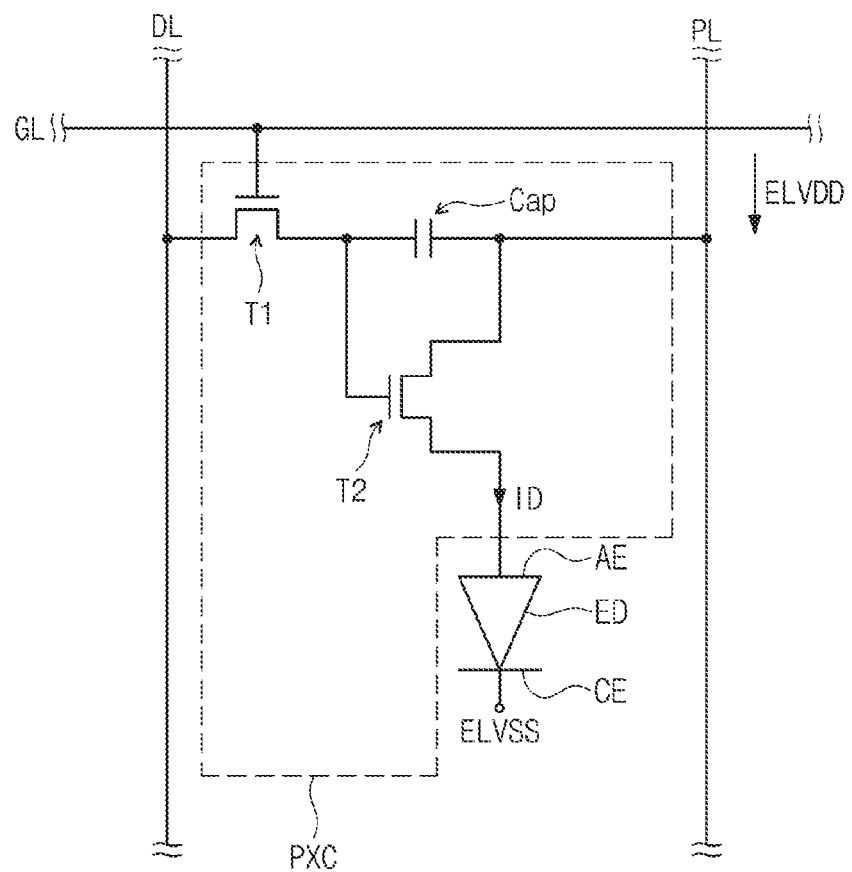
FIG. 3B is an equivalent circuit diagram of a pixel illustrated in FIG. 3A.

FIG. 3A is a plan view illustrating a display panel according to an exemplary embodiment of the inventive concept. The display panel of FIG. 3A may be used to implement the display panel of FIG. 1B or FIG. 2. FIG. 3B is an equivalent circuit diagram of a pixel illustrated in FIG. 3A.

Referring to FIG. 3A, the display panel DP includes a driving circuit GDC, a plurality of signal lines SGL, a plurality of first pads PD1 disposed in a first bonding area SPD, and a plurality of pixels PX.

The pixels PX are disposed in the display area DP-DA. Each of the pixels PX may include an organic light emitting diode and a pixel driving circuit connected to the organic light emitting diode. The driving circuit GDC, the signal lines SGL, the first pads PD1 and the pixel driving circuit may be included in the circuit element layer DP-CL illustrated in FIG. 2.

The driving circuit GDC may include a scan driving circuit (or a gate driving circuit). The driving circuit GDC may generate a plurality of scan signals (or gate signals) and may sequentially output the scan signals to a plurality of scan lines GL (or gate lines) to be described below. The driving circuit GDC may further output other control signals to the pixel driving circuits of the pixels PX.

The driving circuit GDC may include a plurality of thin film transistors formed by a same process (e.g., a low-temperature polycrystalline silicon (LTPS) process or a low-temperature polycrystalline oxide (LTPO) process) as the pixel driving circuits of the pixels PX.

The signal lines SGL may be disposed on the base substrate SUB. The signal lines SGL may include scan lines GL, data lines DL, power lines PL, and a control signal line CSL. Each of the scan lines GL may be connected to corresponding ones of the pixels PX, and each of the data lines DL may be connected to corresponding ones of the pixels PX. The power lines PL may be connected to the pixels PX. The control signal line CSL may provide control signals to the driving circuit GDC.

The signal lines SGL may overlap with the display area DP-DA and the non-display area DP-NDA. Each of the signal lines SGL may include a pad portion and a line portion. The line portion may overlap with the display area DP-DA and the non-display area DP-NDA. The pad portion may be connected to an end of the line portion. The pad portion may be disposed in the non-display area DP-NDA and may correspond to each of the first pads PD1 disposed in the first bonding area SPD.

In addition, the display device DD may further include a circuit board PCB connected to the display panel DP. The circuit board PCB may be electrically connected to the display panel DP and may include a plurality of second pads PD2 disposed in a second bonding area DPD. The second pads PD2 may be electrically bonded to the first pads PD1 disposed in the first bonding area SPD of the display panel DP, and thus a plurality of driving signals may be transmitted to the display panel DP through the first and second pads PD1 and PD2. The circuit board PCB may be rigid or flexible. For example, when the circuit board PCB is flexible, a flexible printed circuit board may be used as the circuit board PCB.

Referring to FIG. 3B, one of the pixels PX of FIG. 3A, which is connected to one scan line GL, one data line DL and the power line PL, is illustrated as an example. However, the configuration of the pixel PX is not limited thereto but may be variously modified.

According to an exemplary embodiment of the inventive concept, the pixel PX includes an organic light emitting element ED (e.g., an organic light emitting diode), a first electrode AE (e.g., an anode), a second electrode CE (e.g., a cathode), and a pixel circuit PXC (or a pixel driving circuit). The pixel PX may include the organic light emitting element ED used as a display element.

In an exemplary embodiment, the pixel circuit PXC includes a first transistor (or a switching transistor) T1, a second transistor (or a driving transistor) T2 and a capacitor Cap, which constitute a circuit part for driving the organic light emitting element ED. The pixel circuit PXC may be included in the circuit element layer DP-CL illustrated in FIG. 2.

The organic light emitting element ED may generate light by an electrical signal provided from the first and second transistors T1 and T2.

The first transistor T1 may output a data signal, applied to the data line DL, in response to a scan signal applied to the scan line GL. The capacitor Cap may be charged with a voltage corresponding to the data signal received from the first transistor T1. A first power source voltage ELVDD may be provided to the first electrode AE through the second transistor T2, and a second power source voltage ELVSS may be provided to the second electrode CE. In an embodiment, the second power source voltage ELVSS is lower than the first power source voltage ELVDD.

The second transistor T2 may be electrically connected to the organic light emitting element ED through the first electrode AE. The second transistor T2 may control a driving current ID flowing through the organic light emitting element ED in response to an amount of charge stored in the capacitor Cap. The organic light emitting element ED may emit light during a turn-on period of the second transistor T2.

Figure 4:
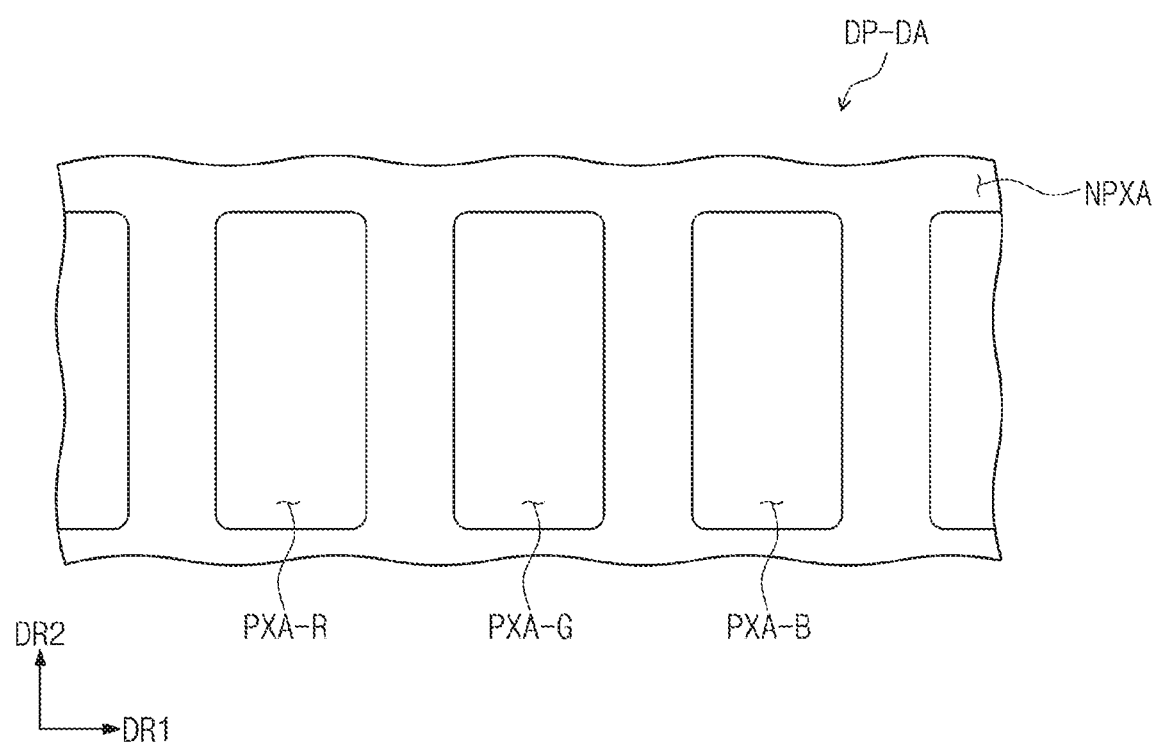
FIG. 4 is a plan view illustrating pixel areas of a display panel according to an exemplary embodiment of the inventive concept.
Figure 5:
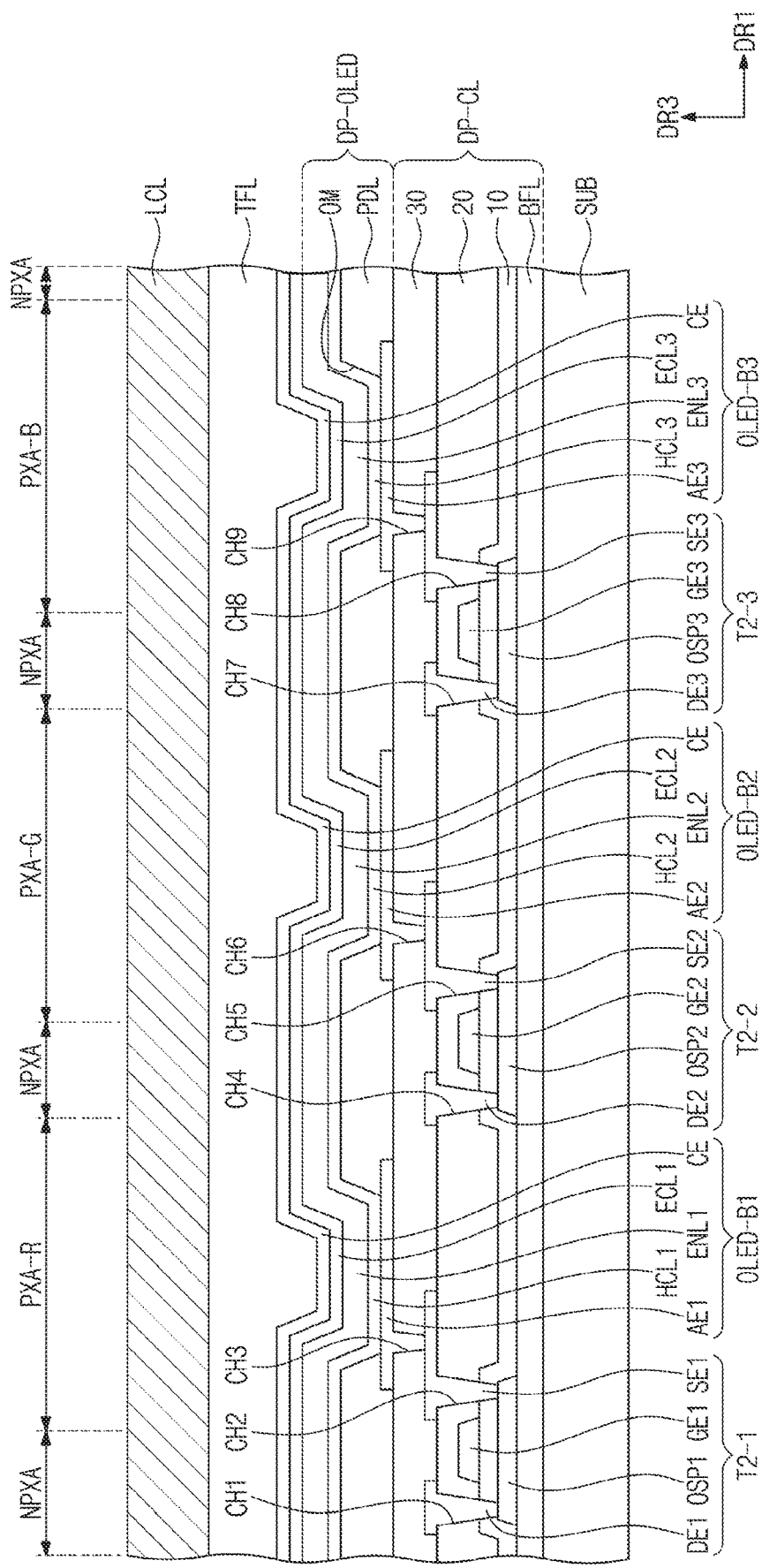
FIG. 5 is a cross-sectional view illustrating a display panel corresponding to the pixel areas of FIG. 4 according to an exemplary embodiment of the inventive concept.

FIG. 4 is a plan view illustrating pixel areas of a display panel according to an embodiment of the inventive concepts. The display panel of FIG. 4 may be used to implement the display panel of FIG. 1B, FIG. 2, or FIG. 3A. FIG. 5 is a cross-sectional view illustrating a display panel corresponding to the pixel areas of FIG. 4 according to an exemplary embodiment of the inventive concept. The display panel of FIG. 5 may be used to implement the display panel of FIG. 1B, FIG. 2, FIG. 3A, or FIG. 4.

FIG. 4 is an enlarged view of a portion of the display area DA illustrated in FIG. 1A. Three types of pixel areas PXA-R, PXA-G and PXA-B are mainly illustrated. The three types of pixel areas PXA-R, PXA-G and PXA-B illustrated in FIG. 4 may be repeatedly disposed in the whole of the display area DA.

In an exemplary embodiment, a light blocking area NPXA is disposed around each of first to third pixel areas PXA-R, PXA-G and PXA-B. The first to third pixel areas PXA-R, PXA-G and PXA-B and the light blocking area NPXA may be defined in the light conversion layer LCL illustrated in FIG. 5.

The first to third pixel areas PXA-R, PXA-G and PXA-B having the same area (or size) are illustrated as an example in FIG. 4. However, embodiments of the inventive concepts are not limited thereto. In certain embodiments, the first to third pixel areas PXA-R, PXA-G and PXA-B have different areas (or sizes) from each other, or at least two of the first to third pixel areas PXA-R, PXA-G and PXA-B have different areas (or sizes) from each other. The first to third pixel areas PXA-R, PXA-G and PXA-B have rectangular shapes having round corners in a plan view in FIG. 4. However, embodiments of the inventive concepts are not limited thereto. In certain embodiments, the first to third pixel areas PXA-R, PXA-G and PXA-B have other polygonal shapes or have regular polygonal shapes having round corners.

In an exemplary embodiment, one of the first to third pixel areas PXA-R, PXA-G and PXA-B provides first color light having a wavelength band of a first color to a user, another thereof provides second color light having a wavelength band of a second color different from the first color to a user, and the other thereof provides third color light having a wavelength band of a third color different from the first and second colors to a user.

According to an exemplary embodiment of the inventive concept, the first pixel area PXA-R provides red light, the second pixel area PXA-G provides green light, and the third pixel area PXA-B provides blue light. In the present embodiment, a source light provides blue light. The source light may be generated from the display element such as the organic light emitting diode.

The light blocking area NPXA may define boundaries of the first to third pixel areas PXA-R, PXA-G and PXA-B and may prevent a color mixing phenomenon between the first to third pixel areas PXA-R, PXA-G and PXA-B. In addition, the light blocking area NPXA may block the source light such that the source light is not provided to a user.

Referring to FIG. 5, the base substrate SUB may include a synthetic resin substrate or a glass substrate. The circuit element layer DP-CL may include at least one insulating layer and a circuit element. The circuit element may include signal lines and the pixel circuit PXC illustrated in FIG. 3B. The circuit element layer DP-CL may be formed through processes of forming the insulating layer, a semiconductor layer and a conductive layer using coating and/or deposition processes and processes of patterning the insulating layer, the semiconductor layer and the conductive layer using photolithography processes.

In an exemplary embodiment, the circuit element layer DP-CL includes a buffer layer BFL, a first insulating layer 10, a second insulating layer 20, a third insulating layer 30, and first to third driving transistors T2-1, T2-2 and T2-3. In an exemplary embodiment, the first insulating layer 10 and the second insulating layer 20 are inorganic layers, and the third insulating layer 30 is an organic layer.

The first driving transistor T2-1 includes a first semiconductor pattern OSP1, a first control electrode GE1, a first input electrode DE1, and a first output electrode SE1. The second driving transistor T2-2 includes a second semiconductor pattern OSP2, a second control electrode GE2, a second input electrode DE2, and a second output electrode SE2. The third driving transistor T2-3 includes a third semiconductor pattern OSP3, a third control electrode GE3, a third input electrode DE3, and a third output electrode SE3.

The first semiconductor pattern OSP1, the second semiconductor pattern OSP2 and the third semiconductor pattern OSP3 may be disposed on the buffer layer BFL provided on the base substrate SUB. The first insulating layer 10 may be disposed on the buffer layer BFL and may cover the first semiconductor pattern OSP1, the second semiconductor pattern OSP2 and the third semiconductor pattern OSP3.

The first control electrode GE1, the second control electrode GE2 and the third control electrode GE3 may be disposed on the first insulating layer 10 and may overlap with the first semiconductor pattern OSP1, the second semiconductor pattern OSP2 and the third semiconductor pattern OSP3, respectively. The second insulating layer 20 may be disposed on the first insulating layer 10 and may cover the first control electrode GE1, the second control electrode GE2 and the third control electrode GE3.

The first input electrode DE1 and the first output electrode SE1 may be disposed on the second insulating layer 20 and may be connected to portions of the first semiconductor pattern OSP1 through a first through-hole CH1 and a second through-hole CH2 penetrating the first and second insulating layers 10 and 20, respectively.

The second input electrode DE2 and the second output electrode SE2 may be disposed on the second insulating layer 20 and may be connected to portions of the second semiconductor pattern OSP2 through a fourth through-hole CH4 and a fifth through-hole CH5 penetrating the first and second insulating layers 10 and 20, respectively.

The third input electrode DE3 and the third output electrode SE3 may be disposed on the second insulating layer 20 and may be connected to portions of the third semiconductor pattern OSP3 through a seventh through-hole CH7 and an eighth through-hole CH8 penetrating the first and second insulating layers 10 and 20, respectively.

The third insulating layer 30 may be disposed on the second insulating layer 20 and may cover the first to third input electrodes DE1, DE2 and DE3 and the first to third output electrodes SE1, SE2 and SE3. The display element layer DP-OLED may be disposed on the third insulating layer 30.

The display element layer DP-OLED may include first to third light emitting elements OLED-B1, OLED-B2 and OLED-B3. According to an exemplary embodiment of the inventive concept, each of the first to third light emitting elements OLED-B1, OLED-B2 and OLED-B3 includes an organic light emitting element configured to generate first color light (e.g., blue light).

The first light emitting element OLED-B1 includes a first sub-electrode AE1, a second electrode CE, a first hole control layer HCL1, a first electron control layer ECL1, and a first emission layer ENL1. The first sub-electrode AE1 may be disposed on the third insulating layer 30. The first sub-electrode AE1 may be connected to the first output electrode SE1 through a third through-hole CH3 penetrating the third insulating layer 30. A pixel defining layer PDL may be provided on the third insulating layer 30, and an emission opening OM may be defined in the pixel defining layer PDL. The emission opening OM of the pixel defining layer PDL may expose at least a portion of the first sub-electrode AE1.

The first hole control layer HCL1 may include a hole transfer layer and may further include a hole injection layer. The first emission layer ENL1 may be disposed on the first hole control layer HCL1. The first emission layer ENL1 may be disposed in an area corresponding to the emission opening OM. The first emission layer ENL1 may emit the first color light. The first electron control layer ECL1 may be disposed on the first emission layer ENL1. The first electron control layer ECL1 may include an electron transfer layer and may further include an electron injection layer.

The second light emitting element OLED-B2 includes a second sub-electrode AE2, a second electrode CE, a second hole control layer HCL2, a second electron control layer ECL2, and a second emission layer ENL2. The second sub-electrode AE2 disposed on the third insulating layer 30 may be connected to the second output electrode SE2 through a sixth through-hole CH6. The second hole control layer HCL2 and the first hole control layer HCL1 may be provided in a single unitary body shape, and the second electron control layer ECL2 and the first electron control layer ECL1 may be provided in a single unitary body shape.

The third light emitting element OLED-B3 includes a third sub-electrode AE3, a second electrode CE, a third hole control layer HCL3, a third electron control layer ECL3, and a third emission layer ENL3. The third sub-electrode AE3 disposed on the third insulating layer 30 may be connected to the third output electrode SE3 through a ninth through-hole CH9. The third hole control layer HCL3 and the first hole control layer HCL1 may be provided in a single unitary body shape, and the third electron control layer ECL3 and the first electron control layer ECL1 may be provided in a single unitary body shape.

Structures of the second and third light emitting elements OLED-B2 and OLED-B3 may be substantially the same as the structure of the first light emitting element OLED-B1.

According to an exemplary embodiment of the inventive concept, each of the first to third emission layers ENL1, ENL2 and ENL3 emit the first color light, and the first to third emission layers ENL1, ENL2 and ENL3 are connected to each other to constitute a single unitary body. In other words, the first to third emission layers ENL1, ENL2 and ENL3 may be disposed in a single unitary body shape on the first to third sub-electrodes AE1, AE2 and AE3. In an exemplary embodiment, the second electrode CE is also provided in a single unitary body shape and may be disposed on the first to third emission layers ENL1, ENL2 and ENL3.

The encapsulation layer TFL may fully cover the display element layer DP-OLED. In other words, the encapsulation layer TFL may prevent foreign materials (e.g., moisture, oxygen and/or dust particles) from permeating into the display element layer DP-OLED.

The light conversion layer LCL may be disposed directly on a base surface provided by the encapsulation layer TFL. The light conversion layer LCL may receive the first color light outputted or emitted from the first to third emission layers ENL1 to ENL3. In an exemplary embodiment, the light conversion layer LCL receives the first color light and outputs light having a different color from that of the first color light. When a component of the light conversion layer LCL is disposed directly on the base surface, an adhesive layer/adhesive member is not disposed between the base surface and the component. The base surface may be a top surface of the encapsulation layer TFL.

Figure 6A:
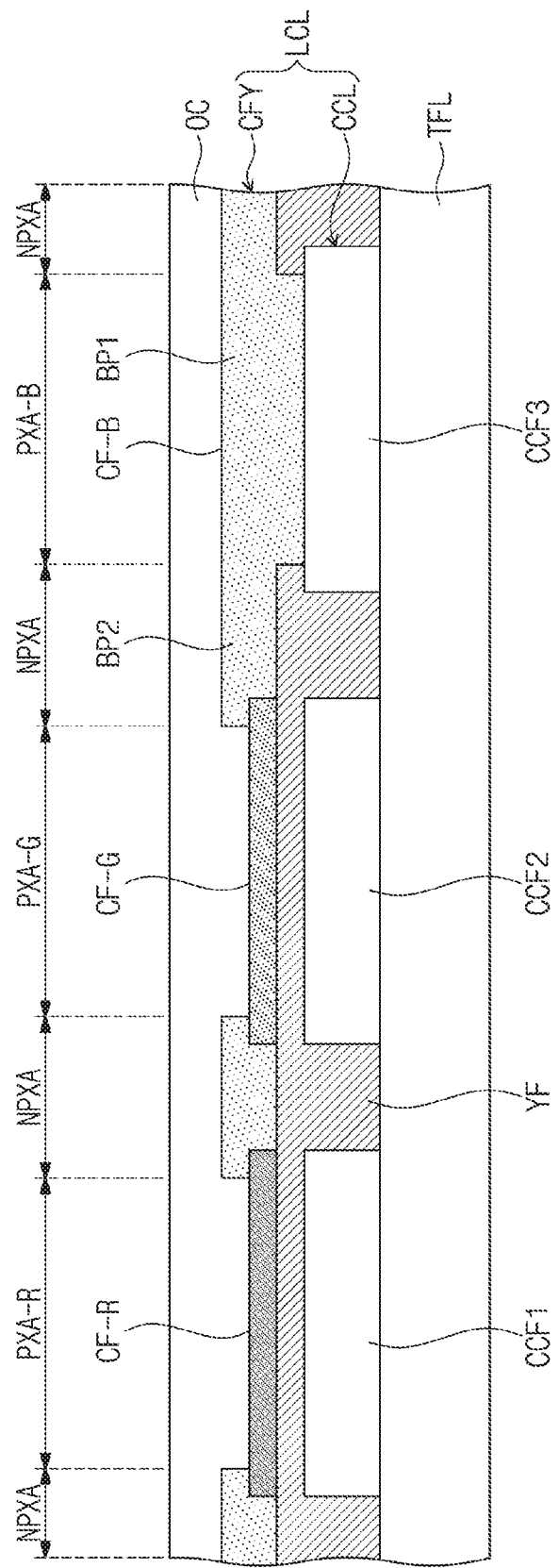
FIG. 6A is a cross-sectional view illustrating a display panel including a light conversion layer according to an exemplary embodiment of the inventive concept.
Figure 6B:
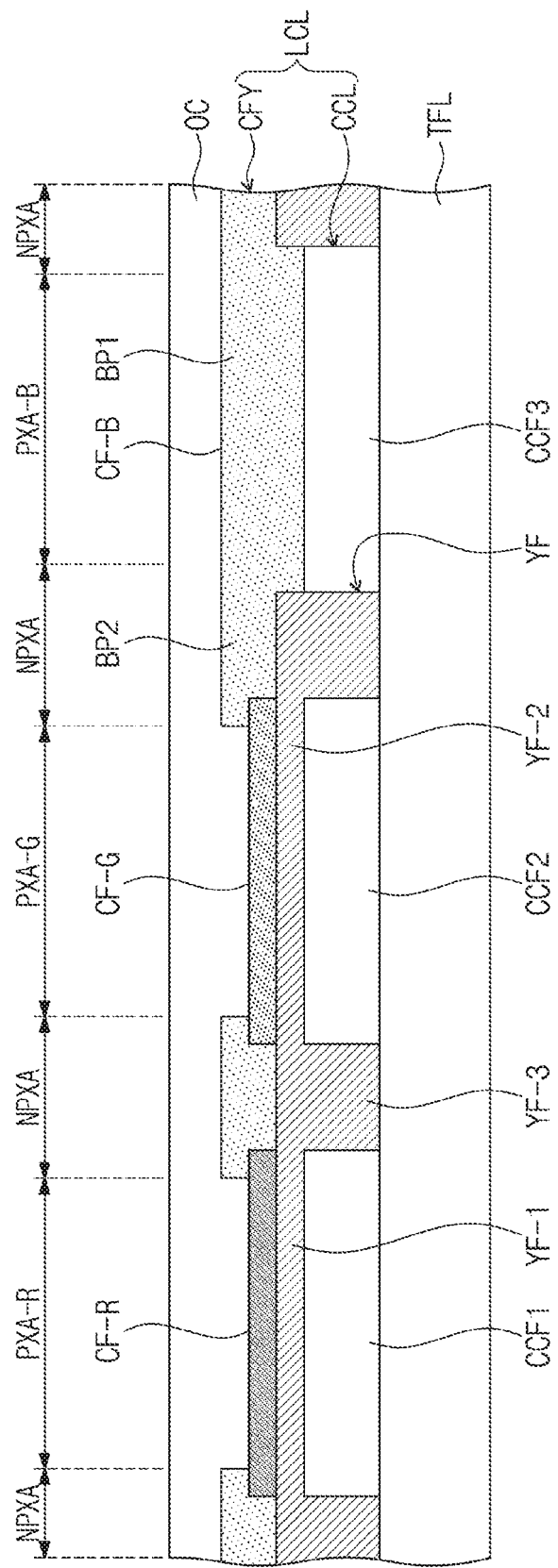
FIG. 6B is a cross-sectional view illustrating a display panel including a light conversion layer according to an exemplary embodiment of the inventive concept.
Figure 7A:
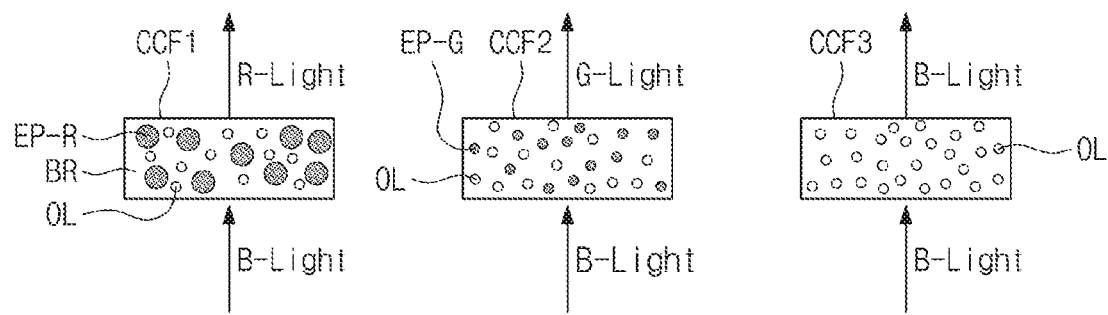
FIG. 7A is a schematic view illustrating optical properties of conversion parts of FIG. 6A.
Figure 7B:
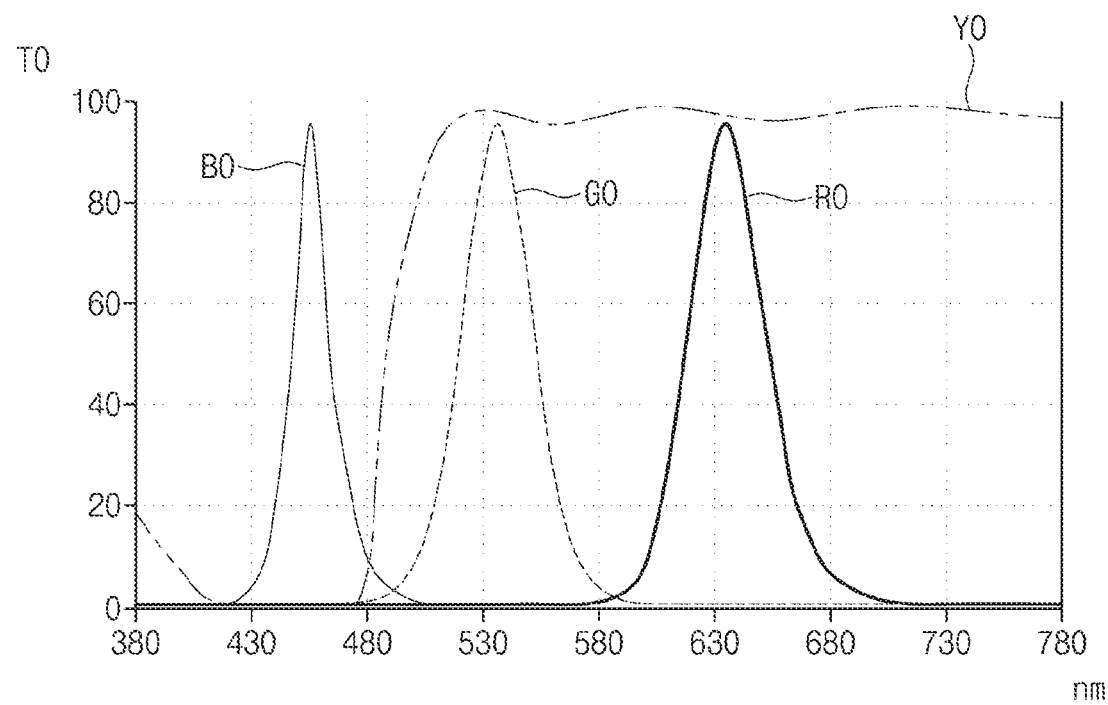
FIG. 7B is a graph showing light absorption characteristics of a light absorbing layer according to an exemplary embodiment of the inventive concept.
Figure 7C:
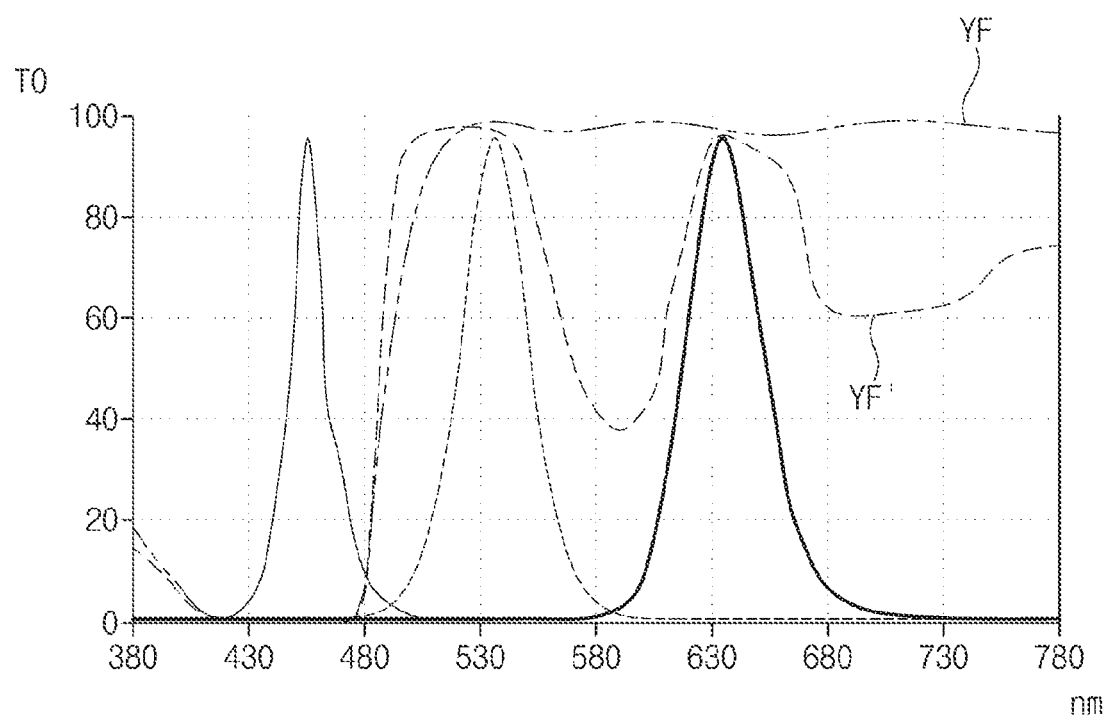
FIG. 7C is a graph showing light absorption characteristics of a light absorbing layer according to an exemplary embodiment of the inventive concept.

FIG. 6A is a cross-sectional view illustrating a display panel including a light conversion layer according to an exemplary embodiment of the inventive concept. FIG. 6B is a cross-sectional view illustrating a display panel including a light conversion layer according to an exemplary embodiment of the inventive concept. FIG. 7A is a schematic view illustrating optical properties of conversion parts of FIG. 6A. FIG. 7B is a graph showing light absorption characteristics of a light absorbing layer according to an exemplary embodiment of the inventive concepts. FIG. 7C is a graph showing light absorption characteristics of a light absorbing layer according to an exemplary embodiment of the inventive concept. The display panel of FIG. 6A or FIG. 6B may be used to implement the display panel of FIG. 1B, FIG. 2, FIG. 3A, FIG. 4, or FIG. 5.

Referring to FIG. 6A, the light conversion layer LCL includes a light control layer CCL, a color filter layer CFY, and a light absorbing layer YF.

The light control layer CCL may be disposed directly on the encapsulation layer TFL. In an exemplary embodiment, the light control layer CCL includes an illuminant which absorbs the first color light outputted from the display element layer DP-OLED (see FIG. 5) and outputs light having a different color from a first color of the first color light. In addition, the first to third pixel areas PXA-R, PXA-G and PXA-B and the light blocking area NPXA may be defined in the light control layer CCL.

In an embodiment, the light control layer CCL includes a first conversion part CCF1, a second conversion part CCF2 and a transmission part CCF3, which are spaced apart from each other when viewed in a plan view. The first conversion part CCF1 may overlap with a first emission opening exposing the first sub-electrode AE1 and the first pixel area PXA-R. In an embodiment, the first conversion part CCF1 absorbs the first color light emitted through the first emission opening and outputs light having a second color different from the first color. Hereinafter, the light having the second color is referred to as second color light. In an embodiment, the first conversion part CCF1 extends slightly to the left past the first pixel area PXA-R partially into a first light blocking area NPXA, and extends slightly to the right past the first pixel area PXA-R partially into a second light blocking area NPXA.

The second conversion part CCF2 may overlap with a second emission opening exposing the second sub-electrode AE2 and the second pixel area PXA-G. In an embodiment, the second conversion part CCF2 absorbs the first color light emitted through the second emission opening and outputs light having a third color different from the first and second colors. Hereinafter, the light having the third color is referred to as third color light. In an embodiment, the second conversion part CCF2 extends slightly to the left past the second pixel area PXA-G partially into the second light blocking area NPXA, and extends slightly to the right past the second pixel area PXA-G partially into a third light blocking area NPXA.

The transmission part CCF3 may overlap with a third emission opening exposing the third sub-electrode AE3 and the third pixel area PXA-B. In an exemplary embodiment, the transmission part CCF3 transmits the first color light emitted through the third emission opening. In an embodiment, the transmission part CCF3 extends slightly to the left past the third pixel area PXA-B partially into the third light blocking area NPXA, and extends slightly to the right past the third pixel area PXA-B partially into a fourth light blocking area NPXA.

In an exemplary, referring to FIG. 7A, a first illuminant EP-R absorbs the first color light (e.g., blue light) and emits the second color light (e.g., red light), and a second illuminant EP-G absorbs the first color light and emits the third color light (e.g., green light). In an exemplary embodiment, the transmission part CCF3 does not include an illuminant. The transmission part CCF3 may transmit the first color light.

In an exemplary embodiment, each of the first conversion part CCF1, the second conversion part CCF2 and the transmission part CCF3 include a base resin BR. The base resin BR may be a polymer resin. For example, the base resin BR may be an acrylic-based resin, a urethane-based resin, a silicon-based resin, or an epoxy-based resin. The base resin BR may be a transparent resin. For example, the first conversion part CCF1 may be a colored resin, the second conversion part CCF2 may be a colored resin, and the transmission part CCF3 may be a clear resin.

In an exemplary embodiment, each of the first conversion part CCF1, the second conversion part CCF2 and the transmission part CCF3 further include scattering particles OL. The scattering particles OL may be $TiO_2$ or silica-based nanoparticles. The scattering particles OL may scatter light emitted from the illuminants in such a way that the scattered light is outputted to the outside of the conversion parts. In the transmission part CCF3 transmitting provided light without changing the provided light, the scattering particles OL may scatter the provided light to output the provided light to the outside.

The first and second illuminants EP-R and EP-G included in the color control layer CCL may be fluorescent substances or quantum dots. In other words, in an embodiment, the color control layer CCL may include at least one of the fluorescent substances or the quantum dots as the illuminants EP-R and EP-G.

For example, the fluorescent substances used as the illuminants EP-R and EP-G may be inorganic fluorescent substances. In the display device DD according to an exemplary embodiment, the fluorescent substances used as the illuminants EP-R and EP-G are a red fluorescent substance and a green fluorescent substance, respectively.

The green fluorescent substance may include at least one selected from a group consisting of $YBO_3:Ce^{3+},Tb^{3+}$, $BaMgAl_{10}O_{17}:Eu^{2+}, Mn^{2+}$, $(Sr,Ca,Ba)(Al,Ga)_2S_4:Eu^{2+}$; $ZnS:Cu,Al$, $Ca_8Mg(SiO_4)_4l_2:Eu^{2+},Mn^{2+}$; $Ba_2SiO_4:Eu^{2+}$; $(Ba,Sr)_2SiO_4:Eu^{2+}$; $Ba_2(Mg, Zn)Si_2O_7:Eu^{2+}$; $(Ba,Sr)Al_2O_4:Eu^{2+}$, $Sr_2Si_3O_8 \cdot 2SrCl_2:Eu^{2+}$.

The red fluorescent substance may include at least one selected from a group consisting of $(Sr,Ca,Ba,Mg)P_2O_7:Eu^{2+}$, $Mn^{2+}$, $CaLa_2S_4:Ce^{3+}$; $SrY_2S_4:Eu^{2+}$, $(Ca,Sr)S:Eu^{2+}$, $SrS:Eu^{2+}$, $Y_2O_3:Eu^{3+},Bi^{3+}$; $YVO_4:Eu^{3+},Bi^{3+}$; $Y_2O_2S:Eu^{3+},Bi^{3+}$; $Y_2O_2S:Eu^{3+}$.

However, the types of the fluorescent substances used in the color control layer CCL are not limited to the materials described above. In other words, the fluorescent substances may use other known fluorescent substances in addition to the fluorescent substance materials described above.

In an exemplary embodiment, the illuminants EP-R and EP-G included in the color control layer CCL are quantum dots. The quantum dot may be formed of a group II-VI compound, a group III-V compound, a group IV-VI compound, a group IV element, a group IV compound, or any combination thereof.

The group II-VI compound may be selected from a group consisting of a binary compound selected from a group consisting of CdSe, CdTe, ZnS, ZnSe, ZnTe, ZnO, HgS, HgSe, HgTe, MgSe, MgS, and any mixture thereof; a ternary compound selected from a group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; and a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and any mixture thereof.

The group III-V compound may be selected from a group consisting of a binary compound selected from a group consisting of GaN, GaP, GaAs, GaSb, AN, AlP, AlAs, AlSb, InN, InP, InAs, InSb, and any mixture thereof; a ternary compound selected from a group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and any mixture thereof; and a quaternary compound selected from a group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof.

The group IV-VI compound may be selected from a group consisting of a binary compound selected from a group consisting of SnS, SnSe, SnTe, PbS, PbSe, PbTe, and any mixture thereof; a ternary compound selected from a group consisting of SnSeS, SnSeTe, SnSTe, PbSeS, PbSeTe, PbSTe, SnPbS, SnPbSe, SnPbTe, and any mixture thereof; and a quaternary compound selected from a group consisting of SnPbSSe, SnPbSeTe, SnPbSTe, and any mixture thereof. The group IV element may be selected from a group consisting of Si, Ge, and a mixture thereof. The group IV compound may be a binary compound selected from a group consisting of SiC, SiGe, and a mixture thereof.

In these cases, the binary compound, the ternary compound, or the quaternary compound may exist in the quantum dot with a substantially uniform concentration. Alternatively, a concentration of the binary compound, the ternary compound or the quaternary compound in a portion of the quantum dot may be different from that of the binary compound, the ternary compound or the quaternary compound in another portion of the quantum dot.

The quantum dot may have a core-shell structure including a core and a shell surrounding the core. Alternatively, the control part may have a core/shell structure in which one quantum dot surrounds another quantum dot. An interface of the core and the shell may have a concentration gradient in which a concentration of an element existing in the shell becomes progressively less toward a center.

The quantum dot may be a nano-sized particle. The quantum dot may have a full width of half maximum (FWHM) of an emission wavelength spectrum that is about 45 nm or less (in particular, about 40 nm or less, and in more particular, about 30 nm or less), and color purity and/or color reproduction can be improved in the range. In addition, light emitted through the quantum dot may be emitted in all directions, and thus a wide viewing angle can be improved or realized.

Furthermore, a shape of the quantum dot may be a general shape known in the art but is not limited to any specific shape. For example, the quantum dot may have a spherical shape, a pyramidal shape, a multi-arm shape, a cubic nanoparticle shape, a nanotube shape, a nanowire shape, a nanofiber shape, or a nano-plate particle shape.

According to an exemplary embodiment of the inventive concept, a color of light emitted from the quantum dot changes depending on a particle size of the quantum dot. In an exemplary embodiment, when the first illuminant EP-R and the second illuminant EP-G are the quantum dots, a particle size of the first illuminant EP-R is different from a particle size of the second illuminant EP-G. For example, the particle size of the first illuminant EP-R may be greater than the particle size of the second illuminant EP-G. In this case, a wavelength of light emitted from the first illuminant EP-R may be longer than a wavelength of light emitted from the second illuminant EP-G.

Referring again to FIG. 6A, the first color lights outputted from the first to third emission layers ENL1, ENL2 and ENL3 of the display element layer DP-OLED described above may be transferred to the first conversion part CCF1, the second conversion part CCF2 and the transmission part CCF3, respectively.

Meanwhile, light outputted from one of the emission layers may be provided to a corresponding one of the conversion and transmission parts and may also be partially provided to another conversion or transmission part adjacent to the corresponding part. In this case, light may be outputted through the adjacent part as well as the corresponding part, and thus lights having different colors may be mixed with each other.

However, according to an exemplary embodiment of the inventive concept, the light absorbing layer YF overlaps with areas between the first conversion part CCF1, the second conversion part CCF2 and the transmission part CCF3 and may be disposed on the encapsulation layer TFL.

In an exemplary embodiment, the light absorbing layer YF is disposed on the encapsulation layer TFL to cover the first conversion part CCF1 and the second conversion part CCF2. The light absorbing layer YF may expose at least a portion of a top surface of the transmission part CCF3 on the encapsulation layer TFL. For example, an upper left corner, an upper right corner, and both sides of the transmission part CCF3 may be covered by the light absorbing layer YF so that the rest of a top surface of the transmission part CCF3 is not covered by the light absorbing layer YF. Here, the top surface of the transmission part CCF3 may be a surface facing the color filter layer CFY, and a bottom surface of the transmission part CCF3 may be a surface facing the encapsulation layer TFL. As illustrated in FIG. 6A, the top surface of the transmission part CCF3 exposed by the light absorbing layer YF may be in contact with a third color filter CF-B. In this case, the light absorbing layer YF may entirely overlap with the light blocking area NPXA and may overlap with a portion of the transmission part CCF3. The transmission part CCF3 may overlap part of a first light blocking area NPXA between pixel areas PXA-G and PXA-B and overlap part of a second light blocking area NPXA adjacent pixel area PXA-B. For example, the upper left corner of the transmission part CCF3 may be located in the first light blocking area NPXA and upper right corner of the transmission part CCF3 may be located in the second light blocking area NPXA.

In an embodiment, as illustrated in FIG. 6B, the light absorbing layer YF includes a first light absorbing portion YF-1 overlapping with the first pixel area PXA-R, a second light absorbing portion YF-2 overlapping with the second pixel area PXA-G, and a third light absorbing portion YF-3 overlapping with the light blocking area NPXA. In particular, the light absorbing layer YF may overlap with the rest of the light blocking area NPXA except a portion of the light blocking area NPXA which overlaps with the transmission part CCF3. For example, different from FIG. 6A, the light absorbing layer YF does not extend to cover the upper left corner and the upper right corner of the transmission part CCF3.

In an exemplary embodiment, the light absorbing layer YF absorbs light corresponding to a wavelength range of the first color and transmits light corresponding to a wavelength range of the second color and light corresponding to a wavelength range of the third color. Hereinafter, for example, the first color light may have a blue color, the second color light may have a red color, and the third color light may have a green color.

According to an exemplary embodiment of the inventive concept, the light absorbing layer YF may have a yellow color. For example, the light absorbing layer YF may include a base resin and a yellow pigment dispersed in the base resin to have the yellow color.

Thus, the light absorbing layer YF may absorb the first color light transmitted between the first conversion part CCF1, the second conversion part CCF2 and the transmission part CCF3. As a result, a color mixing phenomenon between the first to third pixel areas PXA-R, PXA-G and PXA-B may be prevented.

In addition, according to an exemplary embodiment of the inventive concepts, the light absorbing layer YF fully covers the first and second conversion parts CCF1 and CCF2 among the first conversion part CCF1, the second conversion part CCF2 and the transmission part CCF3.

For example, the first conversion part CCF1 receives the first color light and outputs the second color light. However, a portion of the first color light received in the first conversion part CCF1 may not be absorbed into the first illuminant EP-R but may pass through the first conversion part CCF1. In this case, the second color light outputted from the first illuminant EP-R may be mixed with the first color light not absorbed in the first illuminant EP-R.

However, according to an exemplary embodiment of the inventive concepts, the light absorbing layer YF fully covers the first conversion part CCF1, and thus the first color light not absorbed in the first illuminant EP-R may be absorbed in the light absorbing layer YF.

Likewise, the second conversion part CCF2 receives the first color light and outputs the third color light. However, a portion of the first color light received in the second conversion part CCF2 may not be absorbed into the second illuminant EP-G but may pass through the second conversion part CCF2. In this case, the third color light outputted from the second illuminant EP-G may be mixed with the first color light not absorbed in the second illuminant EP-G.

However, according to an exemplary embodiment of the inventive concept, the light absorbing layer YF fully covers the second conversion part CCF2, and thus the first color light not absorbed in the second illuminant EP-G may be absorbed in the light absorbing layer YF.

In more detail, referring to FIG. 7B, a horizontal axis shows a wavelength (nm) of light, and a vertical axis shows a transmittance (TO) of light. FIG. 7B illustrates a blue wavelength range BO of the first color light, a red wavelength range RO of the second color light, a green wavelength range GO of the third color light, and a yellow wavelength range YO of the color of the light absorbing layer YF as an example.

As shown in FIG. 7B, the yellow wavelength range YO may fully overlap with the green wavelength range GO and the red wavelength range RO. As a result, the red light corresponding to the second color light outputted from the first illuminant of the first conversion part CCF1 may pass through the light absorbing layer YF having the yellow wavelength range YO Likewise, the green light corresponding to the third color light outputted from the second illuminant of the second conversion part CCF2 may pass through the light absorbing layer YF having the yellow wavelength range YO.

In addition, according to an exemplary embodiment of the inventive concept, the light absorbing layer YF includes a light absorbing dye which absorbs light, corresponding to a predetermined wavelength range, of light incident from the outside.

According to an exemplary embodiment of the inventive concept, a light absorbing layer YF' including the light absorbing dye may have a lower light transmittance in a wavelength range between a peak wavelength of the second color light and a peak wavelength of the third color light than the light absorbing layer YF not including the light absorbing dye.

The light absorbing dye included in the light absorbing layer YF may absorb light corresponding to the wavelength range between the peak wavelength of the second color light and the peak wavelength of the third color light. In this case, a peak wavelength of the first color light may be less than the peak wavelength of the third color light, and the peak wavelength of the third color light may be less than the peak wavelength of the second color light.

Therefore, as shown in FIG. 7C, the light absorbing layer YF may absorb the light corresponding to the wavelength range between the peak wavelength of the second color light and the peak wavelength of the third color light, and thus visibility of an image outputted from the first conversion part CCF1, the second conversion part CCF2 and the transmission part CCF3 may be further improved.

The color filter layer CFY may be disposed on the light absorbing layer YF. The color filter layer CFY will be described in more detail with reference to FIGS. 8A to 8C.

Figure 8A:
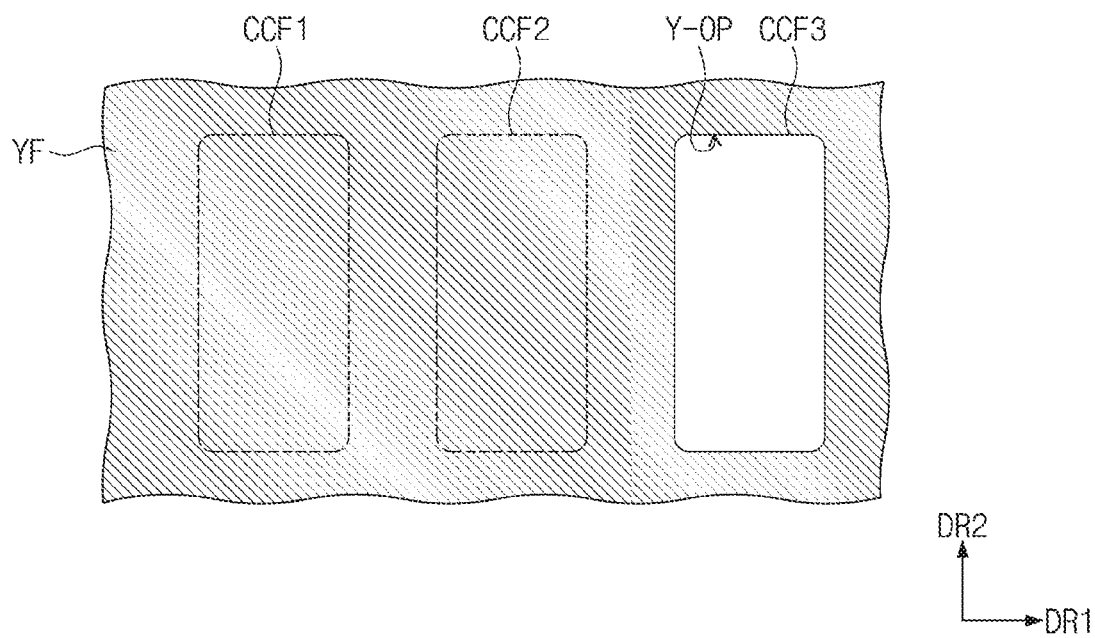
FIG. 8A is a plan view illustrating a light absorbing layer according to an exemplary embodiment of the inventive concept.
Figure 8B:
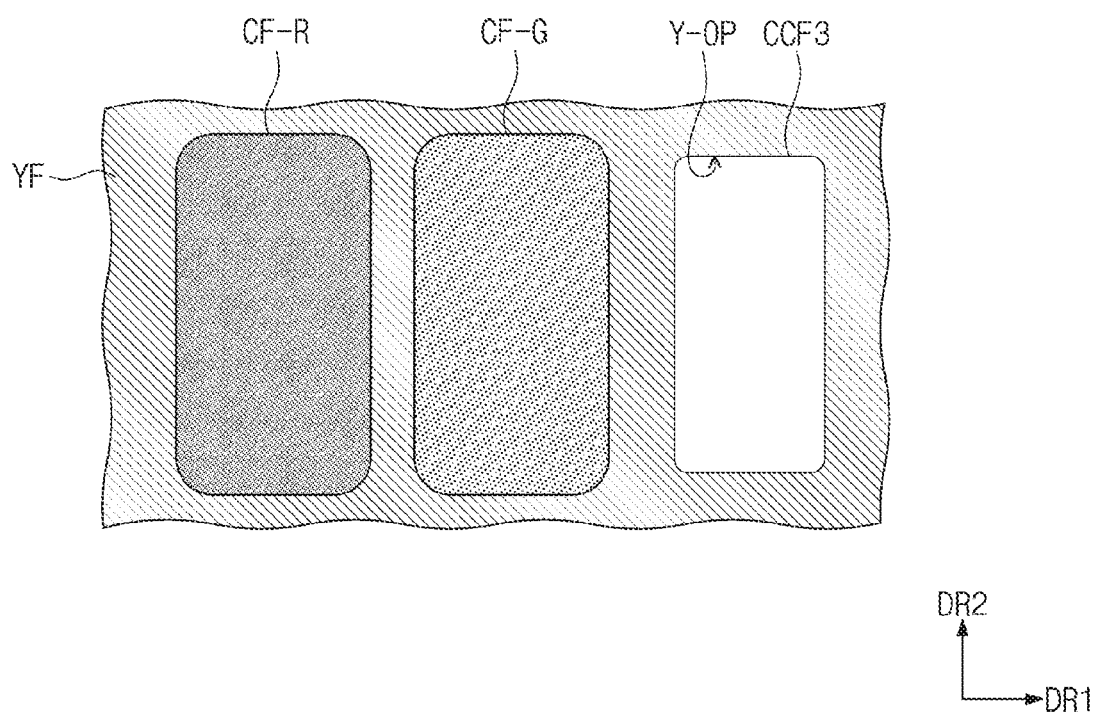
FIG. 8B is a plan view illustrating color filters according to an exemplary embodiment of the inventive concept.
Figure 8C:
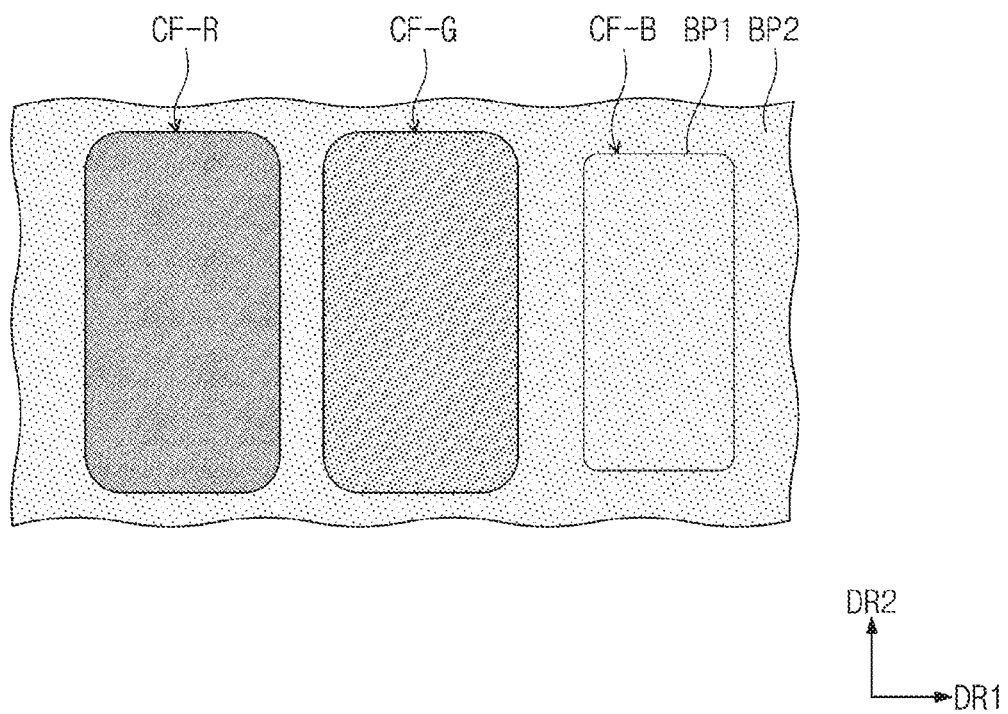
FIG. 8C is a plan view illustrating color filters according to an exemplary embodiment of the inventive concept.

FIG. 8A is a plan view illustrating a light absorbing layer according to an exemplary embodiment of the inventive concepts. The light absorbing layers YF of FIG. 6A and FIG. 6B may be implemented by the light absorbing layer of FIG. 8A. FIG. 8B is a plan view illustrating color filters according to an exemplary embodiment of the inventive concepts. FIG. 8C is a plan view illustrating color filters according to an embodiment of the inventive concepts.

As illustrated in FIG. 6A, the light absorbing layer YF may be disposed on the first conversion part CCF1, the second conversion part CCF2 and the transmission part CCF3 which overlap with the first to third pixel areas PXA-R, PXA-G and PXA-B, respectively. A first portion of the light absorbing layer YF overlapping the light block area NPXA may be disposed between the first conversion part CCF1 and the second conversion part CCF2. A second portion of the light absorbing layer YF overlapping the light block area NPXA may be disposed between the second conversion part CCF2 and the transmission part CCF3.

Referring to FIGS. 6A and 8A, an organic layer having a yellow color may be formed on the light control layer CCL, and then, an exposure and development process may be performed on the organic layer to form the light absorbing layer YF having an opening Y-OP overlapping with the transmission part CCF3. As illustrated in FIG. 8A, the light absorbing layer YF fully covers the first conversion part CCF1 and the second conversion part CCF2 and exposes the transmission part CCF3. For example, the absorbing layer YF may expose an upper surface of the transmission part CCF3.

Referring to FIGS. 6A and 8B, the color filter layer CFY is disposed on the light absorbing layer YF. For example, the color filter layer CFY may include a first color filter CF-R, a second color filter CF-G, and a third color filter CF-B.

For example, the first color filter CF-R may have the second color, may overlap with the first conversion part CCF1, and may be disposed on the light absorbing layer YF. The second color filter CF-G may have the third color, may overlap with the second conversion part CCF2, and may be disposed on the light absorbing layer YF. The third color filter CF-B may have the first color and may overlap with the transmission part CCF3.

According to FIG. 8B, an organic layer having a red color may be formed on the light absorbing layer YF, and then, an exposure and development process may be performed on the organic layer to form the first color filter CF-R overlapping with the first pixel area PXA-R. Thereafter, an organic layer having a green color may be formed on the light absorbing layer YF, and then, an exposure and development process may be performed on the organic layer to form the second color filter CF-G overlapping with the second pixel area PXA-G.

Thereafter, referring to FIG. 8C, an organic layer having a blue color may be formed on the light absorbing layer YF, and then, an exposure and development process may be performed on the organic layer to form the third color filter CF-B overlapping with the third pixel area PXA-B. The third color filter CF-B may include a filter portion BP1 functioning as a color filter and a light blocking portion BP2 functioning as a light blocking pattern. In an exemplary embodiment, the filter portion BP1 overlaps with the third pixel area PXA-B, and the light blocking portion BP2 overlaps with the light blocking area NPXA.

According to an exemplary embodiment of the inventive concept, the light blocking portion BP2 covers a portion of the first color filter CF-R and a portion of the second color filter CF-G and is disposed on the light absorbing layer YF. In other words, the light blocking portion BP2 may overlap with the light blocking area NPXA to prevent a color mixing phenomenon between the pixel areas.

Referring again to FIG. 6A, the color filter layer CFY may inhibit reflection of external light. For example, the first color filter CF-R may block light in a remaining wavelength range except the wavelength range of the second color among light incident from the outside. As a result, the reflection of the external light may be reduced. In addition, the second color light is not absorbed by the first illuminant of the first conversion part CCF1 but passes through the first conversion part CCF1, and thus the first conversion part CCF1 is not activated by the external light. The external light (i.e., the light incident from the outside) may mean light incident from the outside of the display device DD.

The second color filter CF-G may block light in a remaining wavelength range except the wavelength range of the third color among the light incident from the outside. The third color filter CF-B may block light in a remaining wavelength range except the wavelength range of the first color among the light incident from the outside. As a result, the reflection of the external light may be reduced. In addition, the third color light is not absorbed by the second illuminant of the second conversion part CCF2 but passes through the second conversion part CCF2, and thus the second conversion part CCF2 is not activated by the external light.

Figure 9:
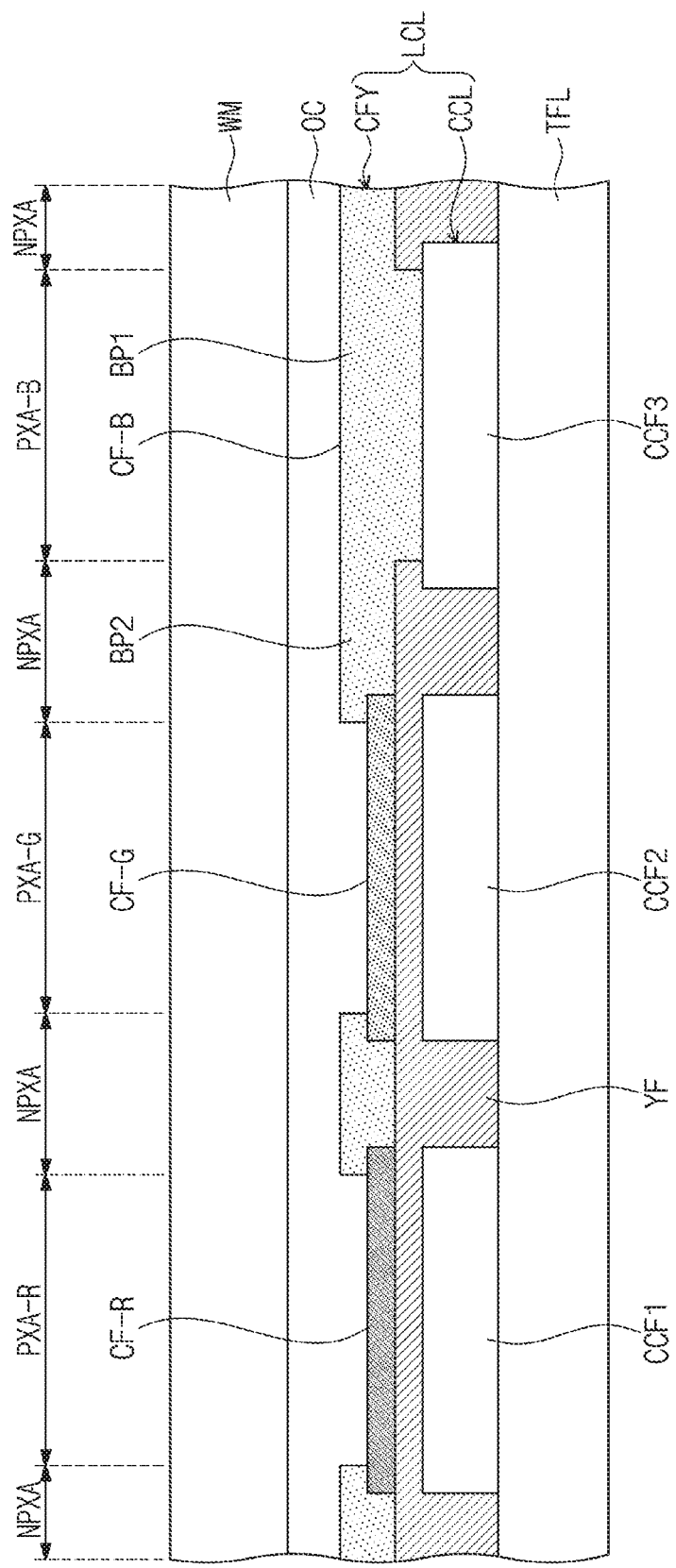
FIG. 9 is a cross-sectional view illustrating a display panel according to an exemplary embodiment of the inventive concept.
Figure 10A:
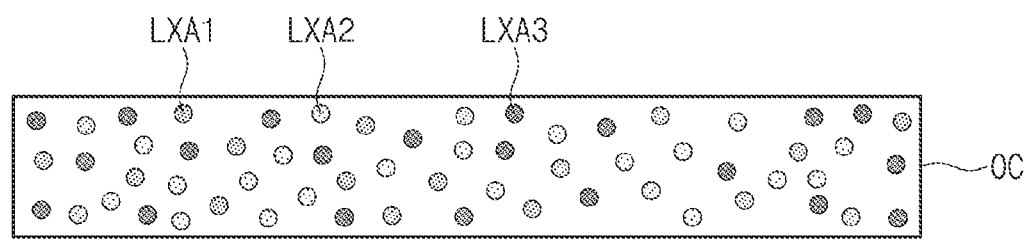
FIG. 10A is a cross-sectional view illustrating an adhesive layer of FIG. 9.
Figure 10B:
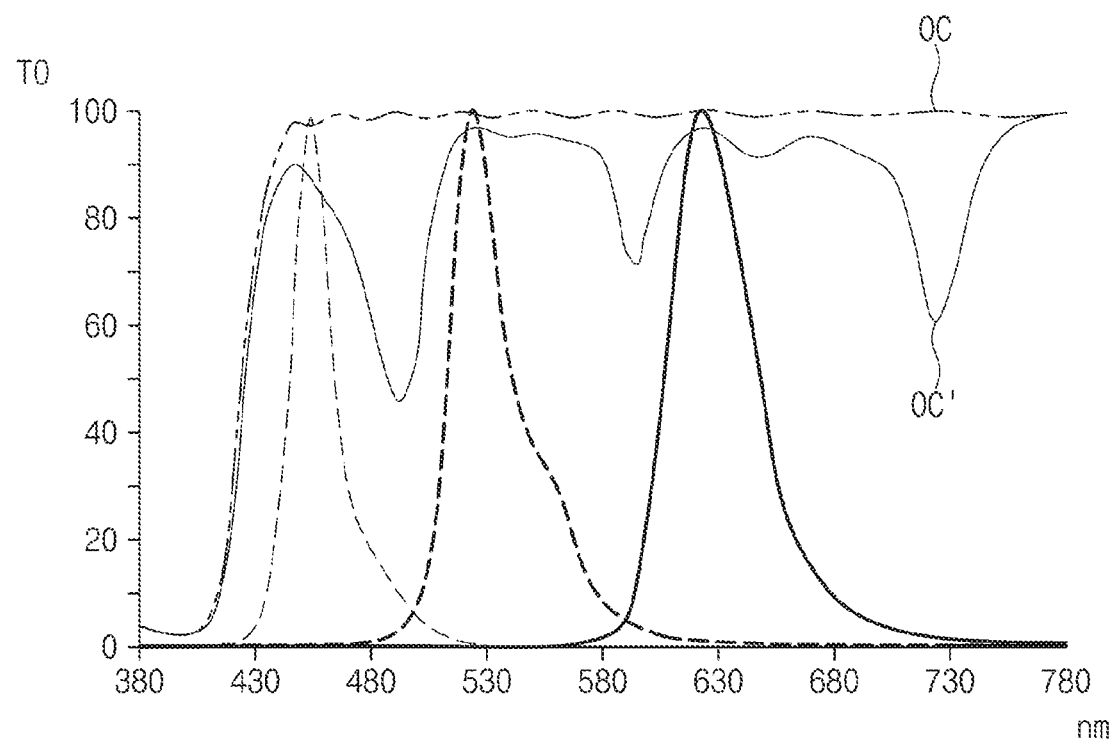
FIG. 10B is a graph showing light absorption characteristics of the adhesive layer illustrated in FIG. 10A.

FIG. 9 is a cross-sectional view illustrating a display panel according to an exemplary embodiment of the inventive concept. The display panel of FIG. 9 may be used to implement the display panel of FIG. 1B, FIG. 2, FIG. 3A, FIG. 4, FIG. 5, FIG. 6A, or FIG. 6B. FIG. 10A is a cross-sectional view illustrating an adhesive layer of FIG. 9. FIG. 10B is a graph showing light absorption characteristics of the adhesive layer illustrated in FIG. 10A.

A light conversion layer LCL illustrated in FIG. 9 may be substantially the same as the light conversion layer LCL illustrated in FIG. 6A.

Referring to FIG. 9, an adhesive layer OC and a window WM are sequentially stacked on the light conversion layer LCL. The adhesive layer OC may be an optically clear adhesive (OCA) film, an optically clear resin (OCR), or a pressure sensitive adhesive (PSA) film. In an exemplary embodiment, the adhesive layer OC covers the color filter layer CFY.

According to an exemplary embodiment of the inventive concept, the adhesive layer OC includes a light absorbing dye which absorbs light, corresponding to a predetermined wavelength range, of light incident from the outside.

Referring to FIG. 10A, the adhesive layer OC includes a first absorbing dye LXA1, a second absorbing dye LXA2, and a third absorbing dye LXA3.

In an exemplary embodiment, the first absorbing dye LXA1 absorbs light corresponding to a first wavelength range between the peak wavelength of the first color light and the peak wavelength of the third color light. In the exemplary embodiment, the second absorbing dye LXA2 absorbs light corresponding to a second wavelength range between the peak wavelength of the second color light and the peak wavelength of the third color light. In the exemplary embodiment, the third absorbing dye LXA3 absorbs light corresponding to a third wavelength range higher than the peak wavelength of the second color light.

Meanwhile, as shown in FIG. 10B, a wavelength range of the adhesive layer OC not including the light absorbing dye fully overlaps with the wavelength range of the first color light, the wavelength range of the second color light, and the wavelength range of the third color light and may have a transmittance which is substantially constant in a total wavelength range.

According to an exemplary embodiment of the inventive concept, the adhesive layer OC' including the light absorbing dye has a lower light transmittance in the wavelength range between the peak wavelength of the first color light and the peak wavelength of the third color light than the adhesive layer OC not including the light absorbing dye.

In an exemplary embodiment, the adhesive layer OC' including the light absorbing dye has a lower light transmittance in the wavelength range between the peak wavelength of the second color light and the peak wavelength of the third color light than the adhesive layer OC not including the light absorbing dye.

In an exemplary embodiment, the adhesive layer OC' including the light absorbing dye has a lower light transmittance in the wavelength range higher than the peak wavelength of the second color light, as compared with the adhesive layer OC not including the light absorbing dye.

Figure 11:
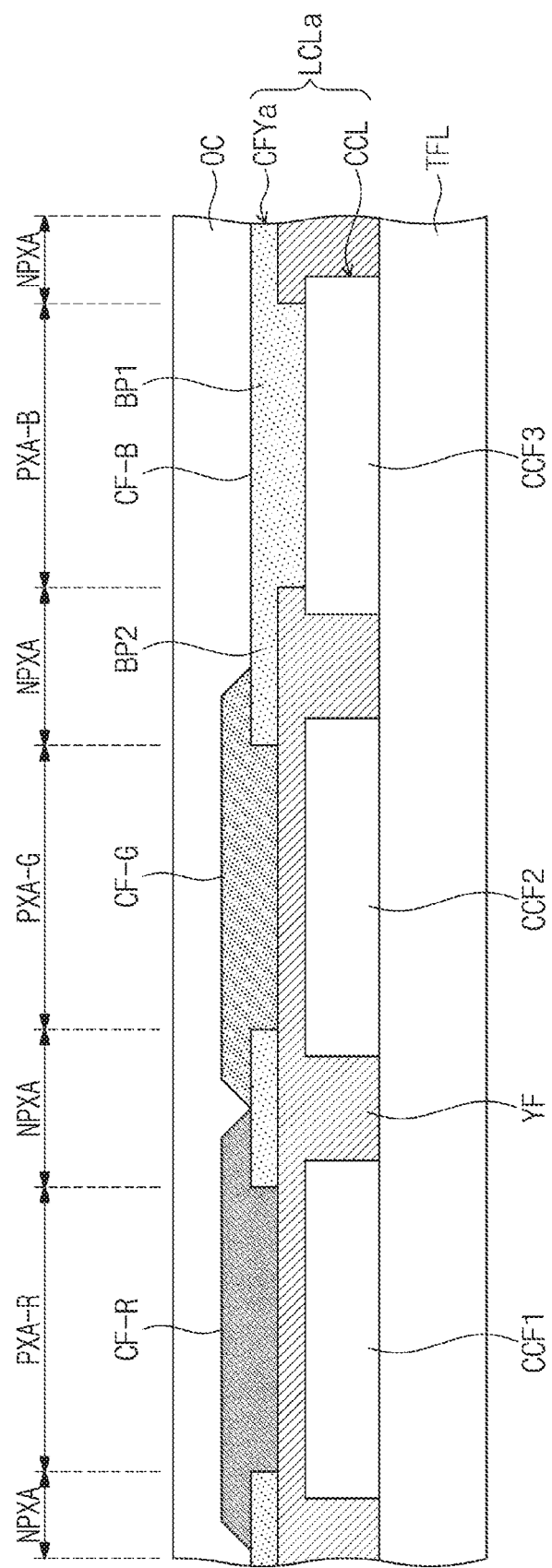
FIG. 11 is a cross-sectional view illustrating a display panel according to an exemplary embodiment of the inventive concept.

FIG. 11 is a cross-sectional view illustrating a display panel according to an exemplary embodiment of the inventive concept. The display panel of FIG. 11 may be used to implement the display panel of FIG. 1B, FIG. 2, FIG. 3A, FIG. 4, FIG. 5, FIG. 6A, or FIG. 6B.

A structure of a color filter layer CFYa of a light conversion layer LCLa of FIG. 11 may be different from that of the color filter layer CFY of the light conversion layer LCL of FIG. 6A, and the other structures of the light conversion layer LCLa may be substantially the same as corresponding structures of the light conversion layer LCL. Thus, descriptions to the other structures will be omitted for the purpose of ease and convenience in description.

Referring to FIG. 11, the light conversion layer LCLa includes first to third color filters CF-R, CF-G and CF-B.

According to an exemplary embodiment of the inventive concept, an organic layer having a blue color is formed on the light absorbing layer YF, and then, an exposure and development process is performed on the organic layer to first form the third color filter CF-B. In an embodiment, the filter portion BP1 and the light blocking portion BP2 are provided in a single unitary body shape. In an embodiment, the third color filter CF-B includes a first opening overlapping with the first color filter CF-R and a second opening overlapping with the second color filter CF-G.

Thereafter, the first color filter CF-R may be formed to fully cover the first opening. For example, the first color filter CF-R may cover the first opening and a part of the light control layer CCL. The first color filter CF-R may also be disposed on at least a portion of the light blocking portion BP2. The second color filter CF-G may be formed to fully cover the second opening. For example, the second color filter CF-G may cover the second opening and part of the light control layer CCL. The second color filter CF-G may also be disposed on at least a portion of the light blocking portion BP2. The first and second color filters CF-R and CF-G disposed on the light blocking portion BP2 may be in contact with each other. However, embodiments of the inventive concepts are not limited thereto. In another embodiment, the first and second color filters CF-R and CF-G disposed on the light blocking portion BP2 are spaced apart from each other by a certain distance.

In addition, according to an exemplary embodiment of the inventive concept, the encapsulation layer TFL has a blue color corresponding to the first color. As described above, external light in the wavelength range of the second color may be transmitted to the encapsulation layer TFL through the first color filter CF-R and the first conversion part CCF1. In this case, since the encapsulation layer TFL has the blue color corresponding to the first color, the external light having the second color may be absorbed in the encapsulation layer TFL.

In addition, external light in the wavelength range of the third color may be transmitted to the encapsulation layer TFL through the second color filter CF-G and the second conversion part CCF2. In this case, since the encapsulation layer TFL has the blue color corresponding to the first color, the external light having the third color may be absorbed in the encapsulation layer TFL.

The external light passing through the color filter layer CFY may be absorbed by the encapsulation layer TFL as described above, and thus the reflection of the external light may be reduced overall. In an exemplary embodiment, the first color filter CF-R has downwardly sloping left and right edges, the second first color filter CF-R has downwardly sloping left and right edges, and the right sloping edge of the first color filter CF-R contacts the left sloping edge of the second color filter CF-G.

Figure 12:
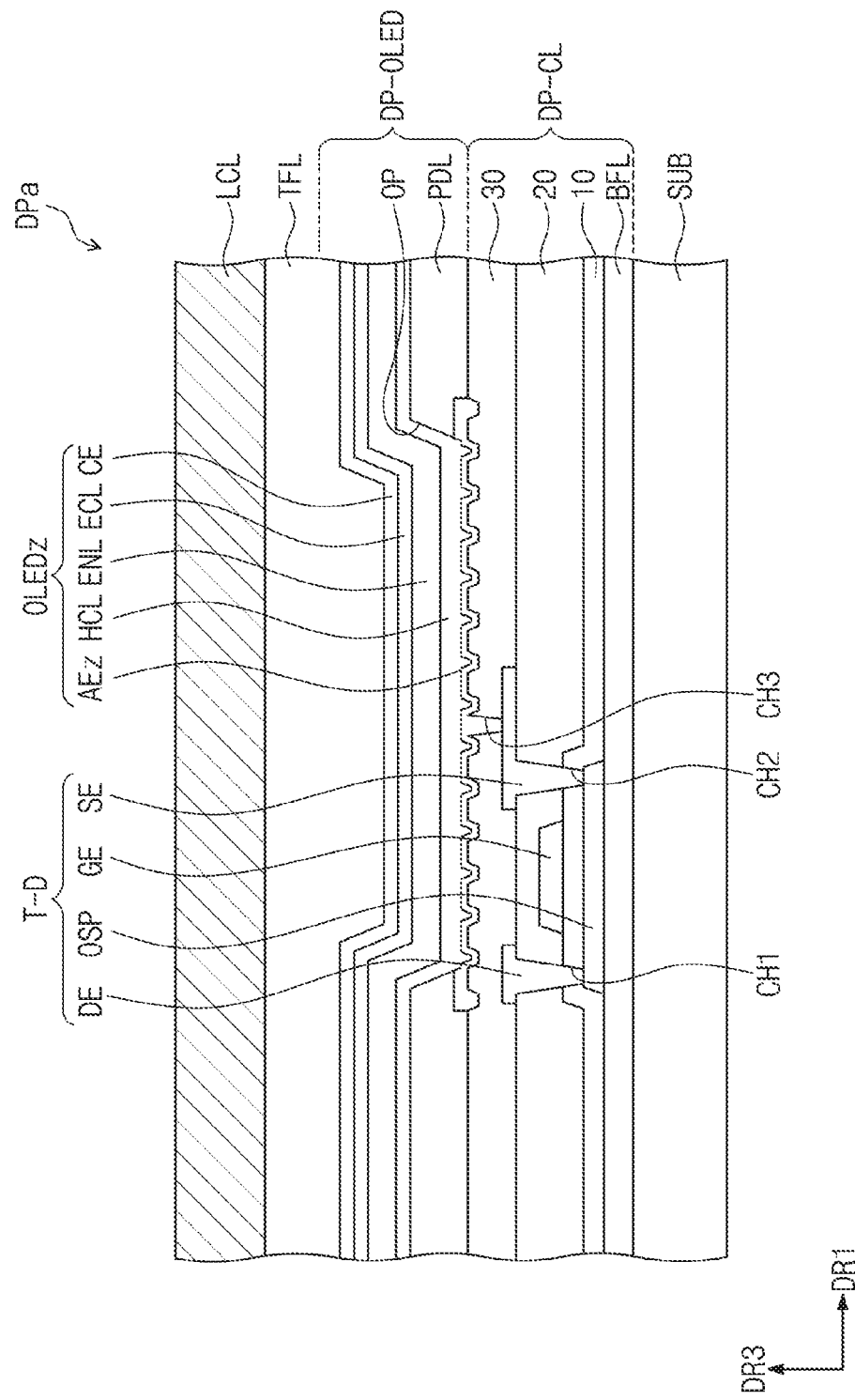
FIG. 12 is a cross-sectional view illustrating a display panel according to an exemplary embodiment of the inventive concept.

FIG. 12 is a cross-sectional view illustrating a display panel according to an exemplary embodiment of the inventive concept.

Except for a shape of a first electrode AEz included in the display element layer DP-OLED, the other components of a display panel DPa of FIG. 12 are substantially the same as corresponding components of the display panel DP of FIG. 6A. Thus, descriptions to the other components will be omitted for the purpose of ease and convenience in description.

Referring to FIG. 12, the first electrode AEz is disposed on the third insulating layer 30. According to an exemplary embodiment of the inventive concept, at least one of the first electrode AEz and the second electrode CE included in the display element layer DP-OLED have an uneven shape. For example, the first electrode AEz having the uneven shape is illustrated in FIG. 12. For example, the uneven shape may include a plurality of recesses. For example, the recesses may be spaced apart from each other. In addition, since the first electrode AEz has the uneven shape, a bottom surface of a hole control layer HCL disposed on the first electrode AEz may also have an uneven shape. A top surface of the hole control layer HCL may be in contact with an emission layer ENL, and the bottom surface of the hole control layer HCL may be in contact with the first electrode AEz. Meanwhile, even though not shown in the drawings, the second electrode CE may also have an uneven shape. The display panel DPa includes a driving transistor T-D that is similar to a driving transistor of FIG. 5 (e.g., T2-1). Further, the display panel DPa includes a light emitting element OLEDz that is similar to a light emitting element of FIG. 5 (e.g., OLED-B1) except that it includes a first electrode AEz with an uneven shape, and may also include a second electrode CE that has an uneven shape.

When external light is transmitted to the display element layer DP-OLED as described above, the external light may be reflected by the first electrode or the second electrode in parallel to an incident direction. However, since the first electrode AEz according to the present embodiment has the uneven shape, a traveling direction of the reflected external light may be changed as compared with the incident direction of the external light. As a result, the reflected external light may not be outputted through the display surface for displaying an image but may be partially absorbed in another layer.

According to at least one exemplary embodiment of the inventive concepts, a display device capable of preventing the color mixing phenomenon between the pixel areas may be provided or realized. As a result, overall visibility of the display device may be improved.

While the inventive concept has been described with reference to exemplary embodiments thereof, it will be apparent to those skilled in the art that various changes and modifications may be made without departing from the spirit and scope of the inventive concept.

What is claimed is:
1. A display panel comprising:
 a display element layer configured to output first color light;
 an encapsulation layer disposed on the display element layer;
 a light control layer disposed on the encapsulation layer, the light control layer comprising:
  a first conversion part configured to receive the first color light and to output second color light different from the first color light;
  a second conversion part configured to receive the first color light and to output third color light different from the first color light and the second color light; and
  a transmission part configured to transmit the first color light;

a light absorbing layer disposed on the encapsulation layer to cover upper and side surfaces of the first and second conversion parts and expose at least a portion of a top surface of the transmission part; and a color filter layer disposed on the light absorbing layer, wherein the light absorbing layer is configured to absorb the first color light and to transmit the second color light and the third color light, wherein the light absorbing layer is a single unitary layer.

2. The display panel of claim 1, wherein the first conversion part, the second conversion part and the transmission part are spaced apart from each other in a plan view and are disposed directly on the encapsulation layer, wherein the light absorbing layer overlaps an area between the first conversion part and the second conversion part, and an area between the second conversion part and the transmission part.

3. The display panel of claim 1, wherein the color filter layer comprises:

a first color filter which overlaps with the first conversion part, is disposed on the light absorbing layer, and has the second color;

a second color filter which overlaps with the second conversion part, is disposed on the light absorbing layer, and has the third color; and a third color filter overlapping with the transmission part and having the first color.

4. The display panel of claim 3, further comprising first to third pixel areas respectively overlapping with the first to third color filters and a light blocking area partitioning the first to third pixel areas, and wherein the third pixel area overlaps with the top surface of the transmission part exposed by the light absorbing layer.

5. The display panel of claim 4, wherein the third color filter comprises: a filter portion overlapping with the third pixel area and disposed on the transmission part; and a light blocking portion overlapping with the light blocking area and disposed on the light absorbing layer.

6. The display panel of claim 5, wherein the light blocking portion covers a portion of each of the first and second color filters and is disposed on the light absorbing layer.

7. The display panel of claim 5, wherein the light blocking portion is disposed on the light absorbing layer, and each of the first and second color filters covers at least a portion of the light blocking portion and is disposed on the light absorbing layer.

8. The display panel of claim 1, wherein the first color is a blue color and the light absorbing layer has a yellow color.

9. The display panel of claim 1, wherein the encapsulation layer has the first color.

10. The display panel of claim 1, wherein the light absorbing layer includes a light absorbing dye configured to absorb light, corresponding to a predetermined wavelength range, of light incident from an outside.

11. The display panel of claim 10, wherein the light absorbing dye is configured to absorb light corresponding to a wavelength range between a peak wavelength of the second color light and a peak wavelength of the third color light, wherein a peak wavelength of the first color light is less than the peak wavelength of the third color light, and the peak wavelength of the third color light is less than the peak wavelength of the second color light.

12. The display panel of claim 1, further comprising first to third pixel areas and a light blocking area partitioning the first to third pixel areas, wherein the display element layer comprises: first to third light emitting elements which overlap with the first to third pixel areas, respectively, and each light emitting element comprises a first electrode, a second electrode, and an emission layer between the first and second electrodes, and wherein the emission layers of the first to third light emitting elements are connected to each other to constitute a single unitary body shape.

13. The display panel of claim 12, wherein at least one of the first electrode or the second electrode has an uneven shape.

14. The display panel of claim 1, wherein the first conversion part includes a first illuminant configured to convert the first color light into the second color light, and the second conversion part includes a second illuminant configured to convert the first color light into the third color light.

15. A display device comprising:

a window;

a display panel; and an adhesive layer disposed between the window and the display panel, wherein the display panel comprises:

a display element layer configured to output first color light;

an encapsulation layer disposed on the display element layer;

a light control layer disposed on the encapsulation layer, the light control layer comprising:

a first conversion part configured to receive the first color light and to output second color light different from the first color light;

a second conversion part configured to receive the first color light and to output third color light different from the first color light and the second color light;

and a transmission part configured to transmit the first color light;

a light absorbing layer disposed on the encapsulation layer to integrally cover upper and side surfaces of the first and second conversion parts and expose at least a portion of a top surface of the transmission part; and a color filter layer disposed on the light absorbing layer, wherein the light absorbing layer is configured to absorb the first color light and to transmit the second color light and the third color light, wherein the adhesive layer is disposed between the color filter layer and the window, and wherein the light absorbing layer is a single unitary layer.

16. The display device of claim 15, wherein the adhesive layer includes a light absorbing dye configured to absorb light, corresponding to a predetermined wavelength range, of light incident from an outside.

17. The display device of claim 16, wherein the light absorbing dye includes:

a first absorbing dye configured to absorb light corresponding to a first wavelength range between a peak wavelength of the first color light and a peak wavelength of the third color light; and a second absorbing dye configured to absorb light corresponding to a second wavelength range between a peak wavelength of the second color light and the peak wavelength of the third color light, wherein the peak wavelength of the first color light is less than the peak wavelength of the third color light, and the peak wavelength of the third color light is less than the peak wavelength of the second color light.

18. The display device of claim 17, wherein the light absorbing dye further includes:

a third absorbing dye configured to absorb light corresponding to a third wavelength range higher than the peak wavelength of the second color light.

19. The display device of claim 15, wherein the light control layer is disposed directly on the encapsulation layer, wherein the first color is a blue color and the light absorbing layer has a yellow color.

20. A display panel comprising:
a display element layer comprising first to third light emitting elements configured to output first color light;
an encapsulation layer disposed on the display element layer;
a light control layer which includes first to third pixel areas respectively overlapping with the first to third light emitting elements and a light blocking area partitioning the first to third pixel areas, is disposed on the encapsulation layer, and is configured to receive the first color light and to output second color light different from the first color light; and
a light absorbing layer disposed on the encapsulation layer,
the light absorbing layer comprising:
a first light absorbing portion overlapping with the first pixel area;
a second light absorbing portion overlapping with the second pixel area; and
a third light absorbing portion overlapping with the light blocking area,
wherein each of the first, second, and third light absorbing portions is configured to absorb the first color light and to transmit the second color light,
wherein the light absorbing layer is a single unitary layer.

* * * * *